(12) United States Patent
McCormack et al.

(10) Patent No.: US 7,199,307 B2
(45) Date of Patent: Apr. 3, 2007

(54) STRUCTURE AND METHOD FOR EMBEDDING CAPACITORS IN Z-CONNECTED MULTI-CHIP MODULES

(75) Inventors: Mark Thomas McCormack, Livermore, CA (US); Mike Peters, Santa Clara, CA (US)

(73) Assignee: Fujitsu Limited, Kawasaki (JP)

( * ) Notice: Subject to any disclaimer, the term of this patent is extended or adjusted under 35 U.S.C. 154(b) by 306 days.

(21) Appl. No.: 10/840,920

(22) Filed: May 7, 2004

(65) Prior Publication Data

US 2004/0207042 A1 Oct. 21, 2004

Related U.S. Application Data

(62) Division of application No. 10/007,982, filed on Nov. 13, 2001, now Pat. No. 6,759,257.

(51) Int. Cl.
*H05K 1/16* (2006.01)
*H05K 1/18* (2006.01)

(52) U.S. Cl. .................... 174/260; 361/763
(58) Field of Classification Search ........ 174/261–266, 174/206, 260; 361/791–795, 763, 782
See application file for complete search history.

(56) References Cited

U.S. PATENT DOCUMENTS

| | | | | |
|---|---|---|---|---|
| 4,652,977 A | * | 3/1987 | Jones | 361/793 |
| 5,502,397 A | * | 3/1996 | Buchanan | 324/754 |
| 6,388,207 B1 | * | 5/2002 | Figueroa et al. | 174/262 |
| 6,552,696 B1 | * | 4/2003 | Sievenpiper et al. | 343/909 |
| 6,791,846 B2 | * | 9/2004 | Smith et al. | 361/803 |
| 2001/0032738 A1 | * | 10/2001 | Dibene et al. | 174/260 |

\* cited by examiner

*Primary Examiner*—Dean A. Reichard
*Assistant Examiner*—Jeremy C. Norris
(74) *Attorney, Agent, or Firm*—Sheppard Mullin Richter & Hampton LLP

(57) ABSTRACT

A chip module element having an array of capacitors, a planar interconnect structure coupled to the array of capacitors, and a multilayer circuit structure coupled to the planar interconnect structure. The planar interconnect structure includes a plurality of conductive elements (e.g., z-connections and conductive posts) electrically communicating the capacitors and the multilayer circuit structure. A plurality of conductive pins is coupled to the multilayer circuit structure. The array of capacitors is capable of being charged by providing an electrical current which passes from the pins, through the multilayer circuit structure, through the conductive elements, and to the capacitors. A method for making a chip module element comprising forming an array of capacitors, electrically testing the capacitors in the array to determine which capacitors are defective and which are acceptable, and storing data of the defective capacitors in an information storage medium. The method further includes forming an interconnect structure on the array of capacitors, wherein the interconnect structure includes a plurality of conductive elements, and wherein the conductive elements are electrically coupled to the acceptable capacitors.

5 Claims, 22 Drawing Sheets

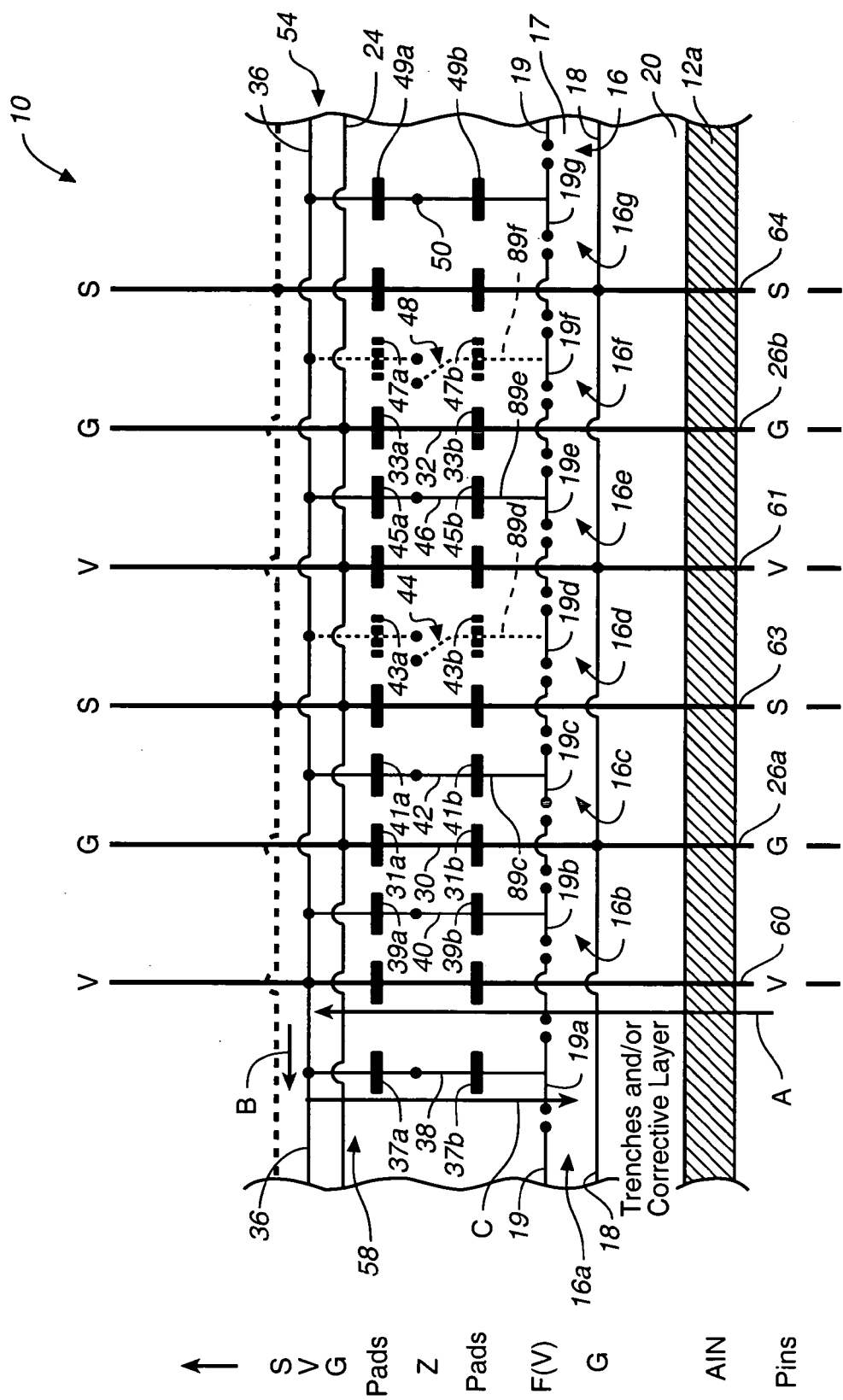
FIG._1

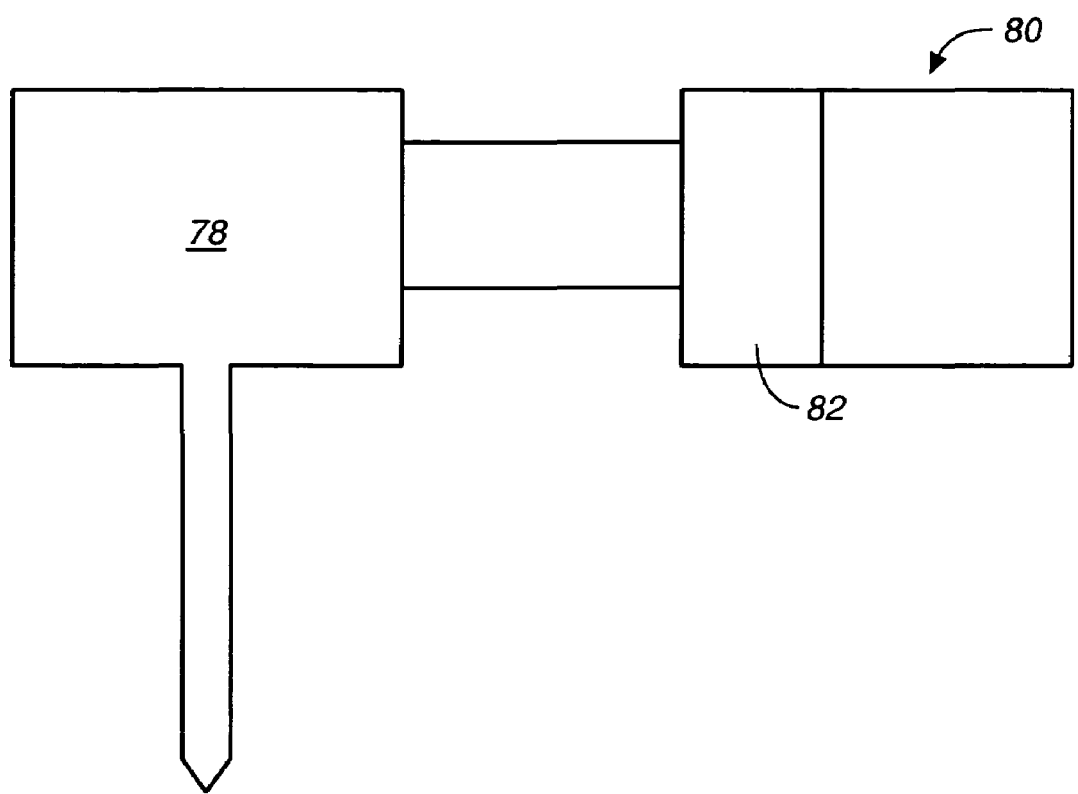
FIG._2A

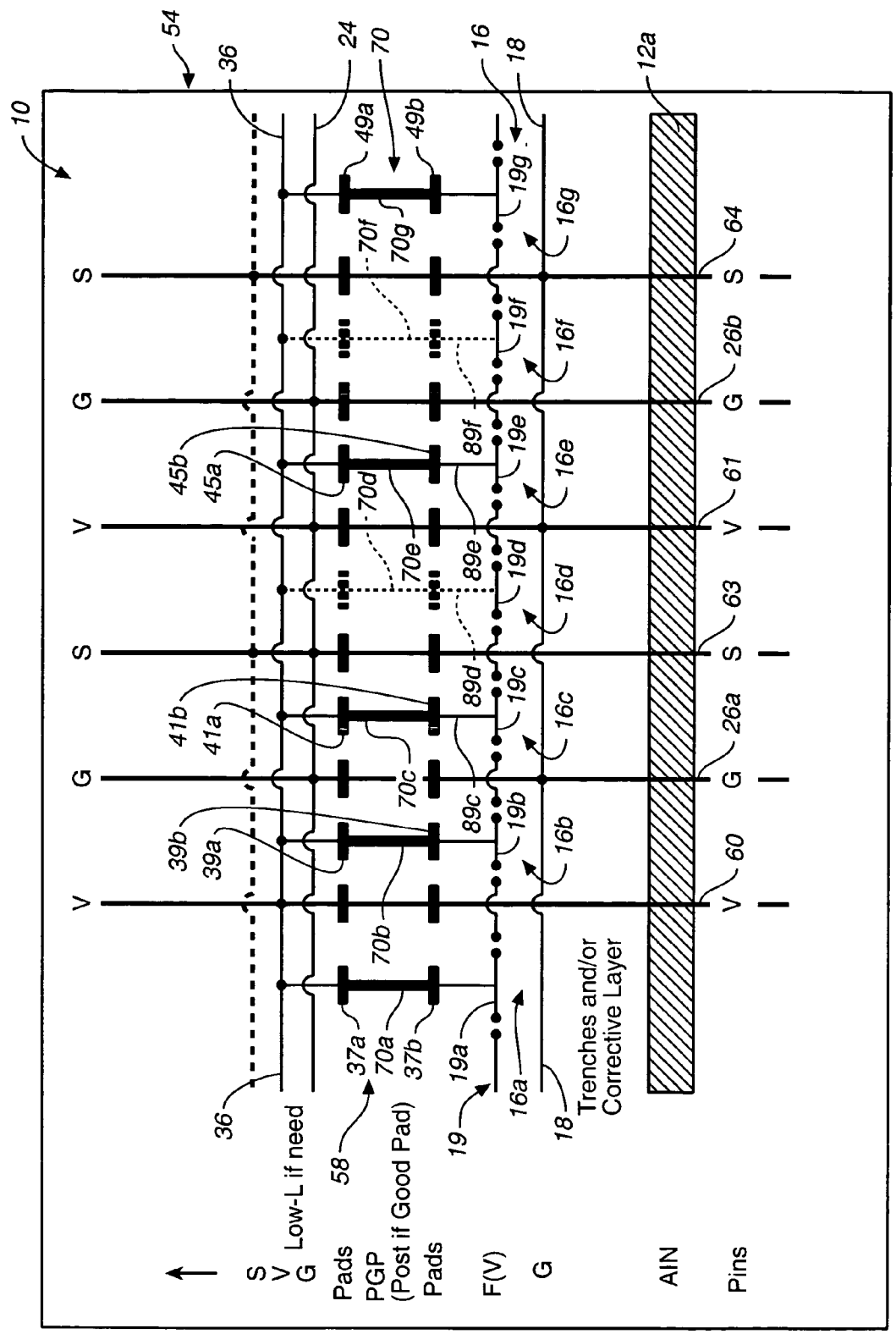
FIG._2B

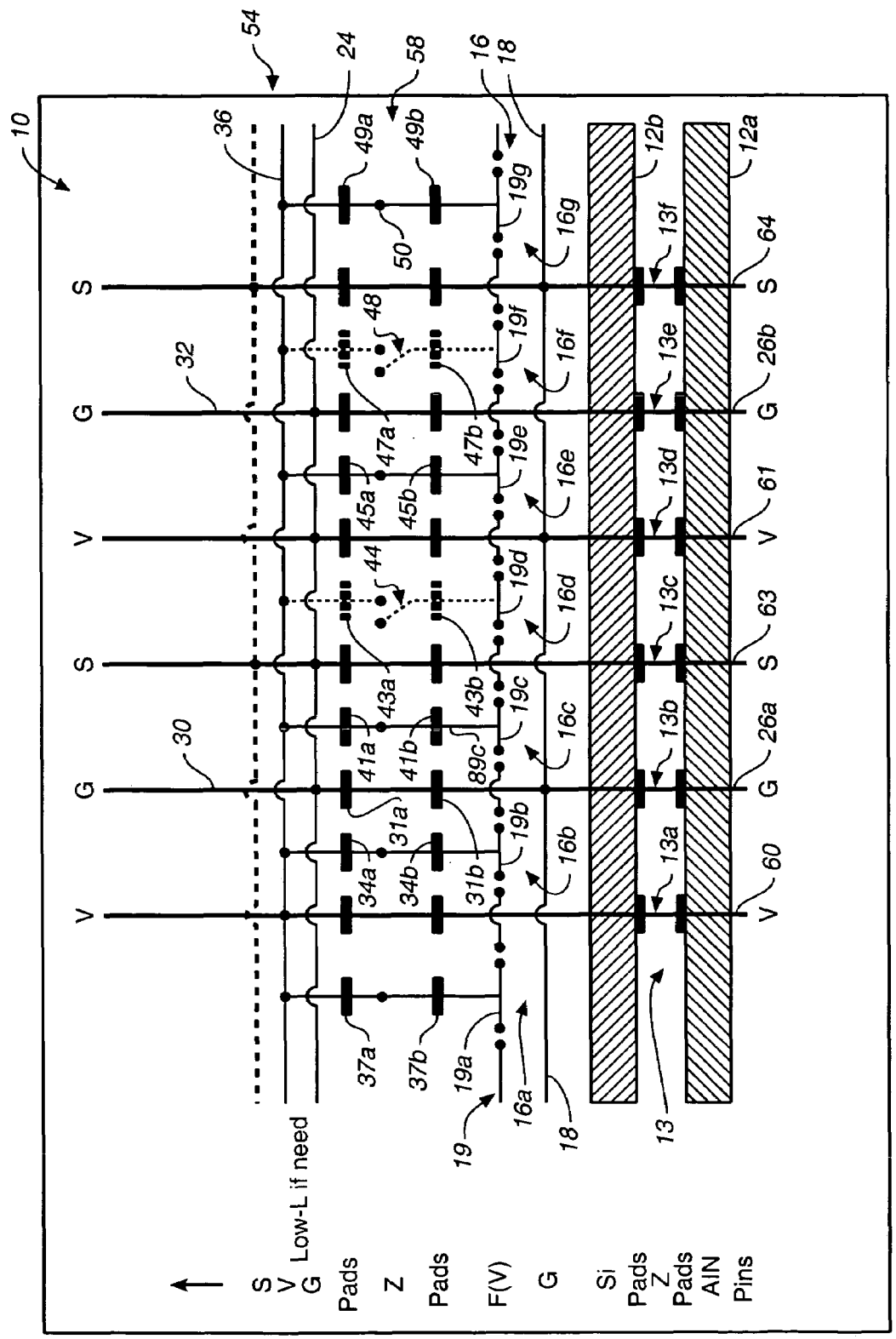
FIG._3A

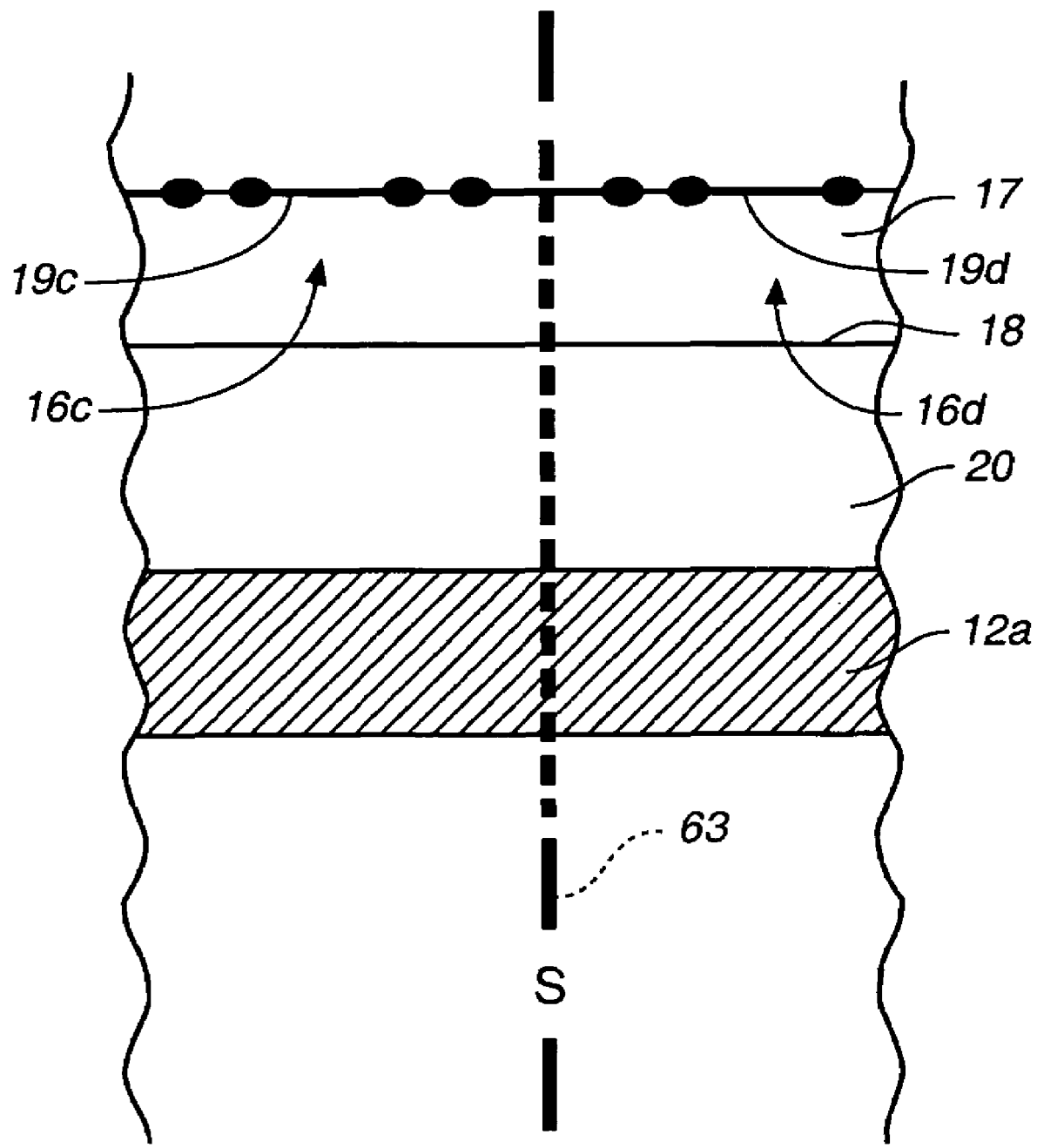
FIG._3B

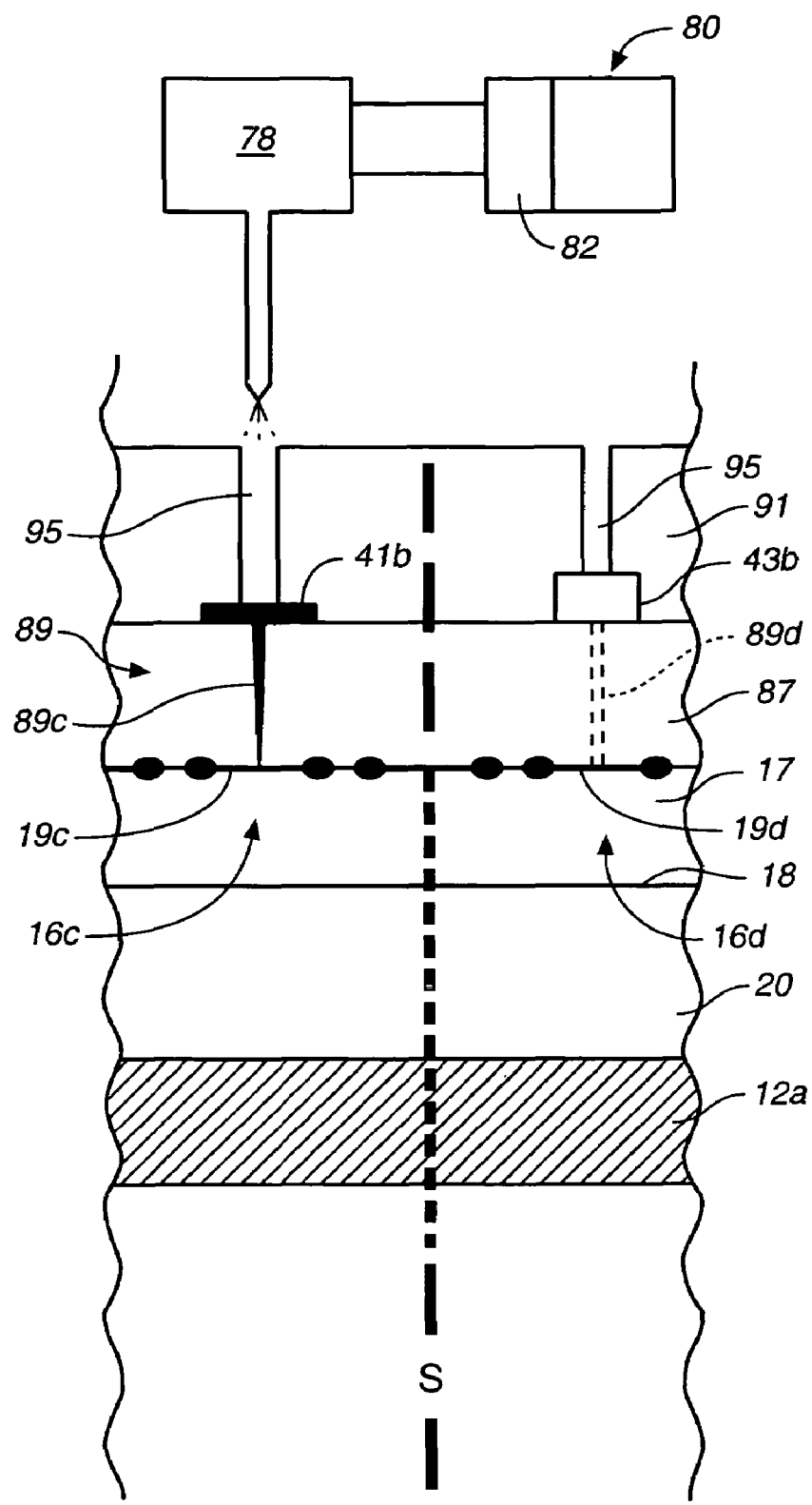
FIG._3C

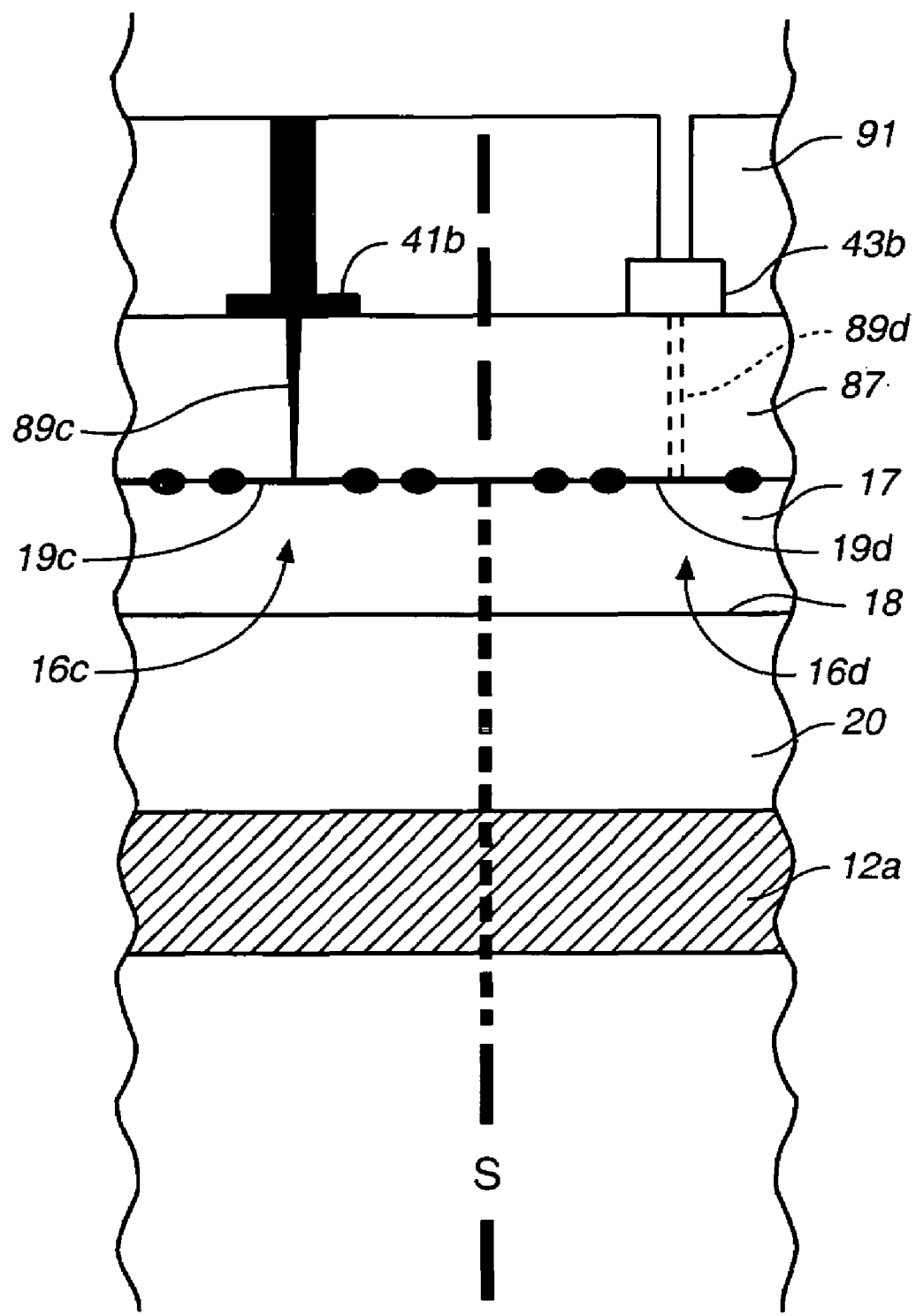
FIG._3D

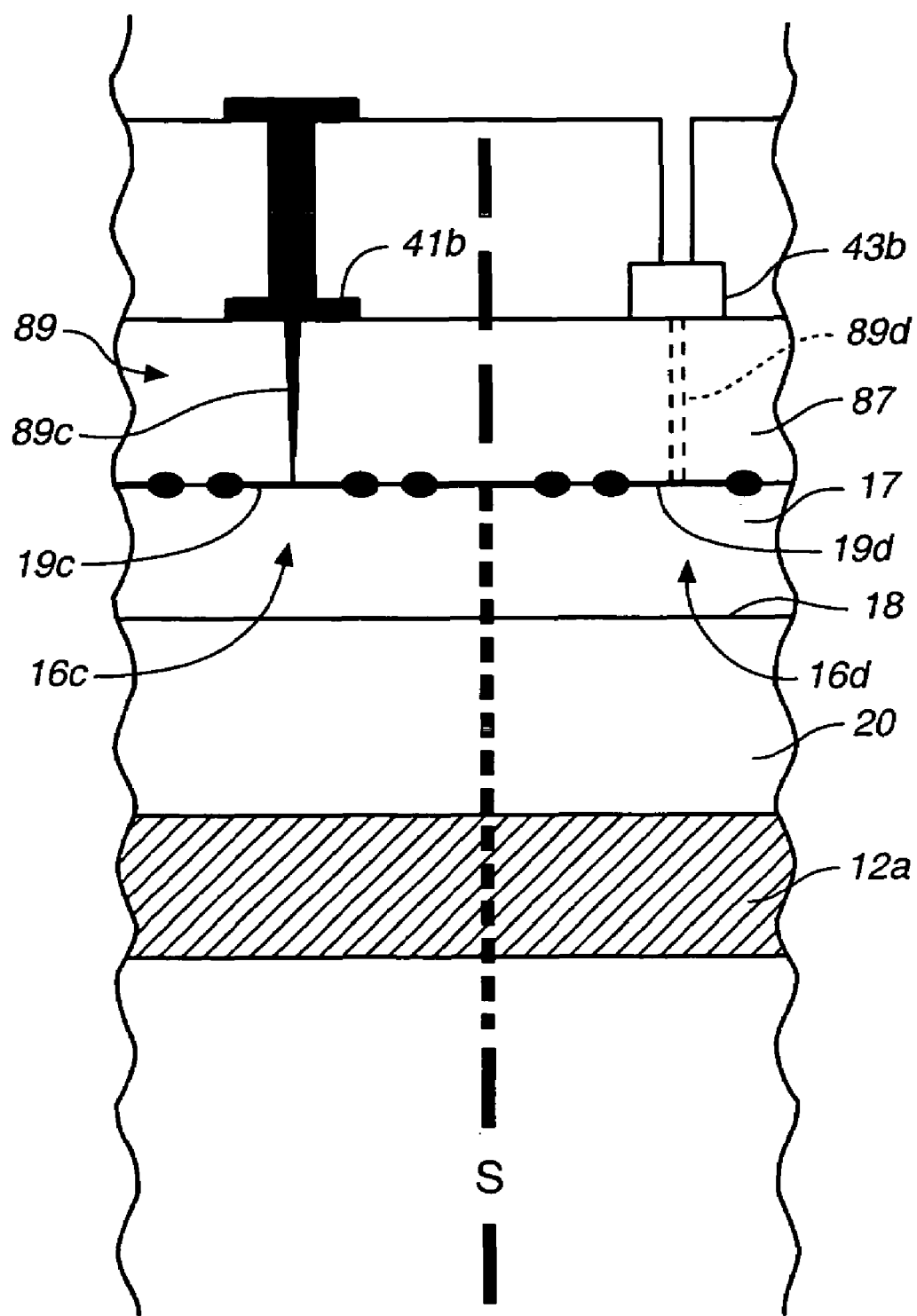
FIG._3E

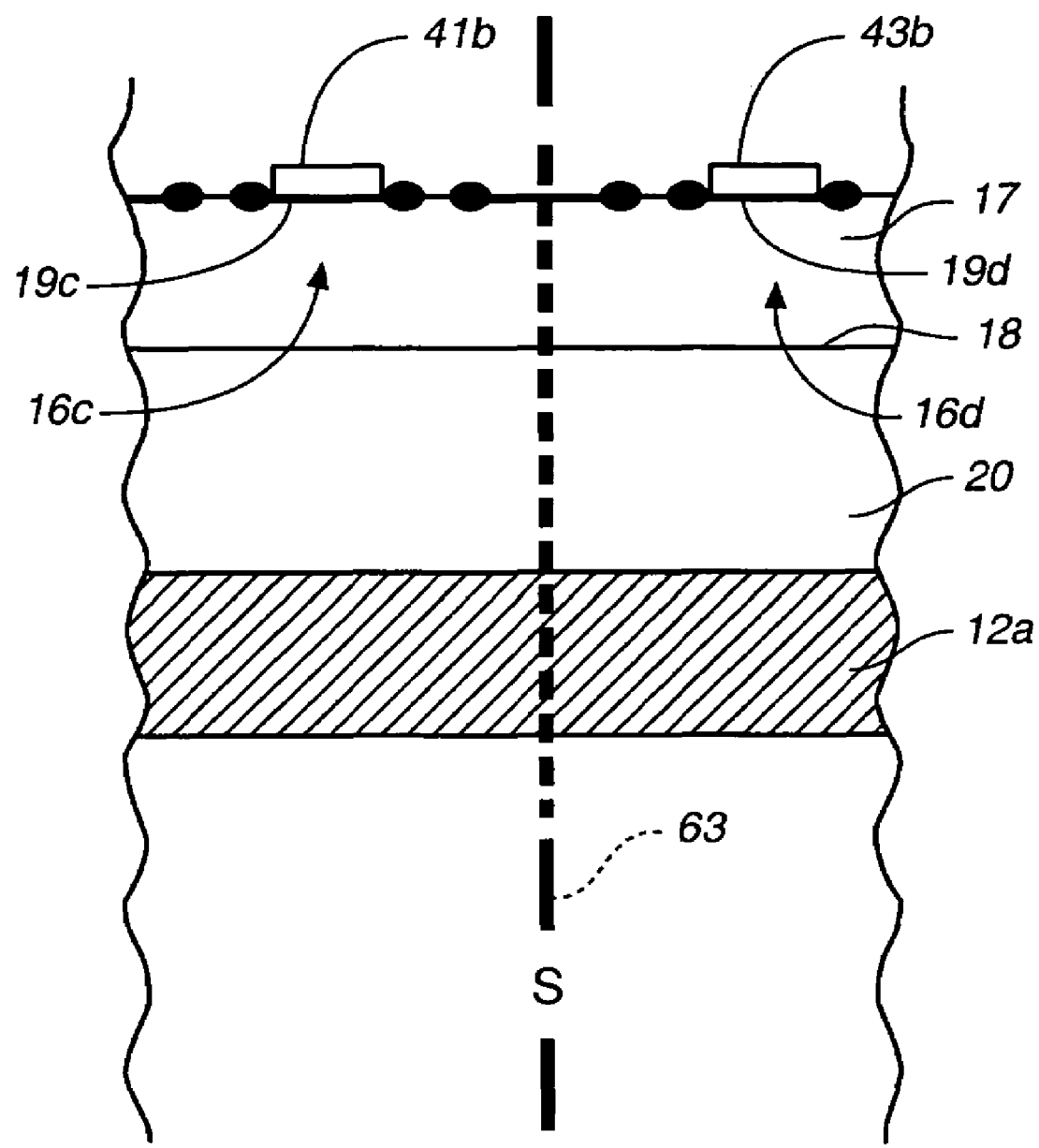
FIG._3F

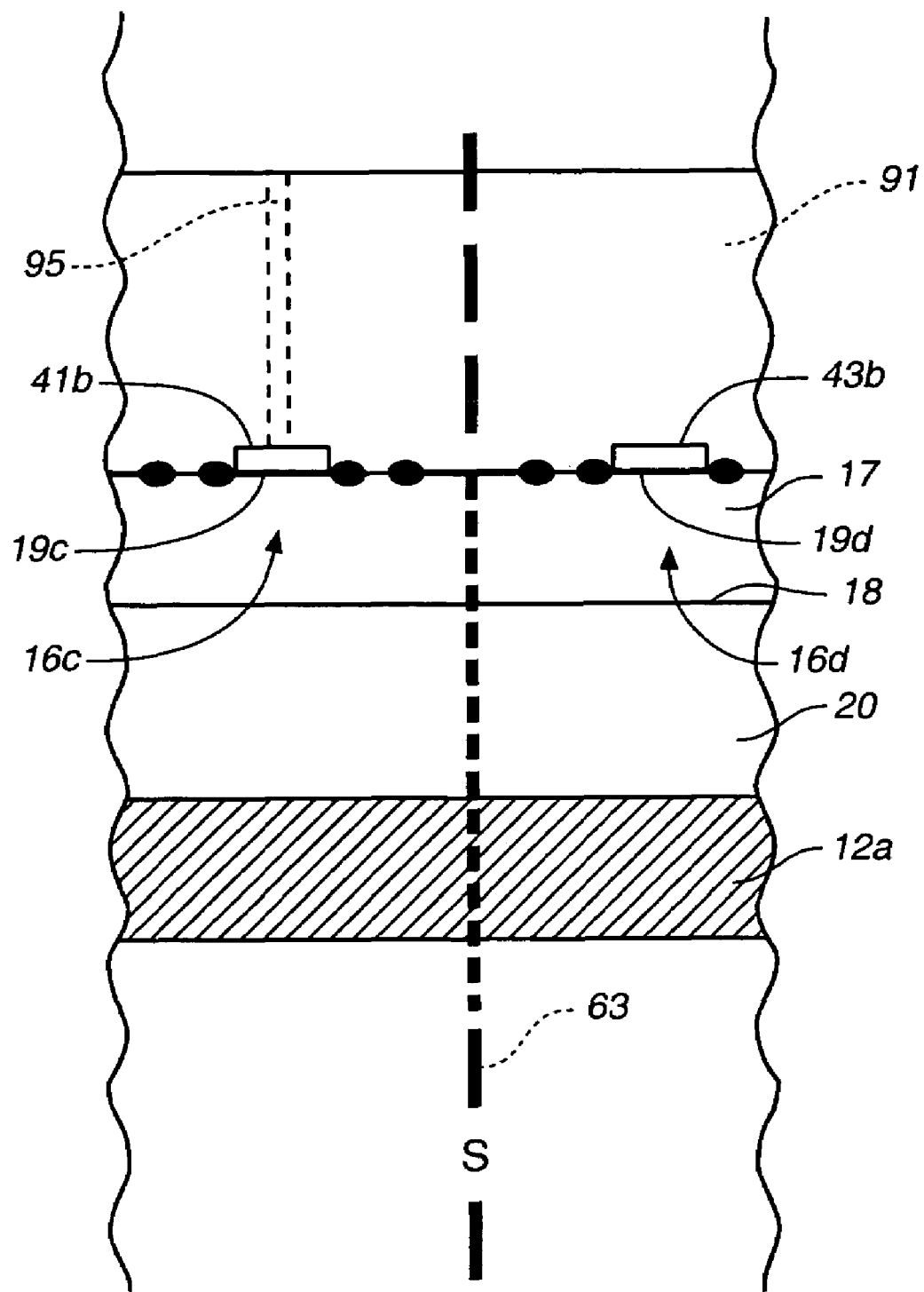
FIG._3G

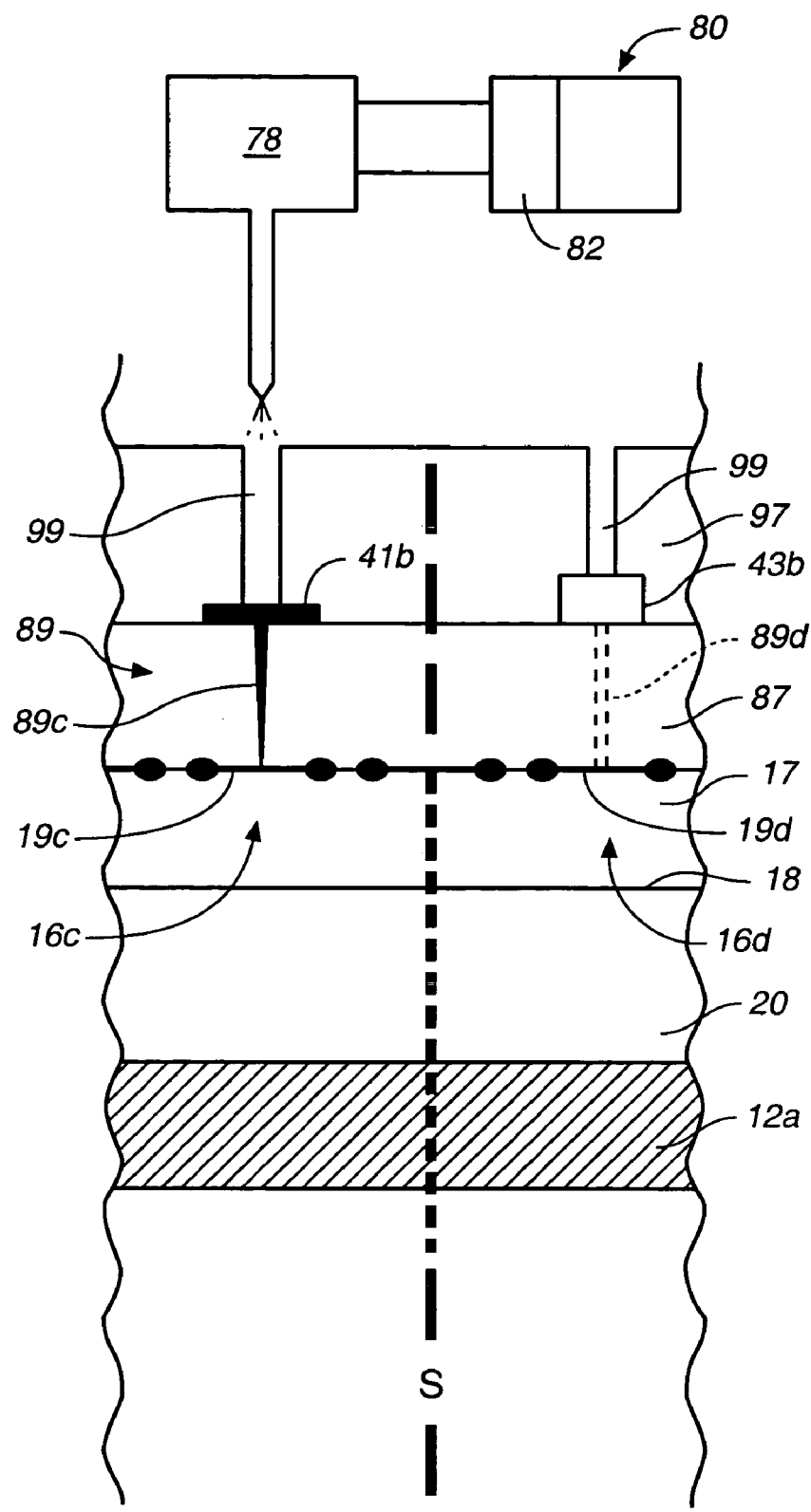
FIG._3H

FIG._4
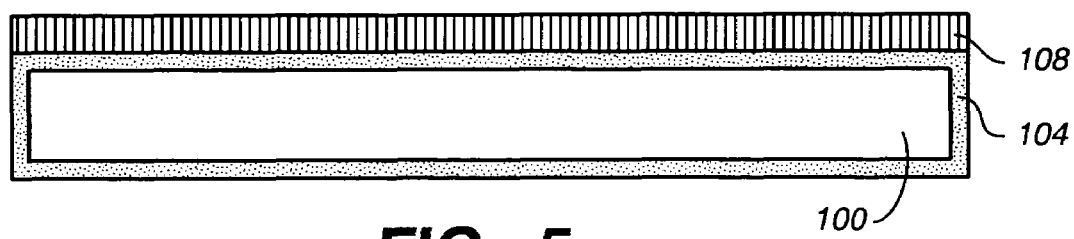
FIG._5
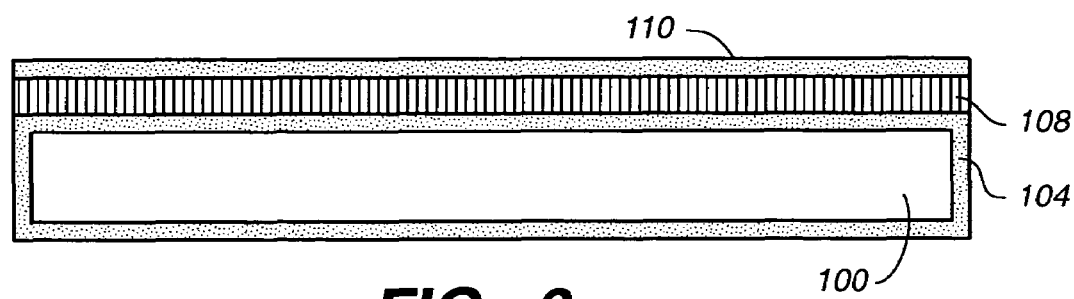
FIG._6
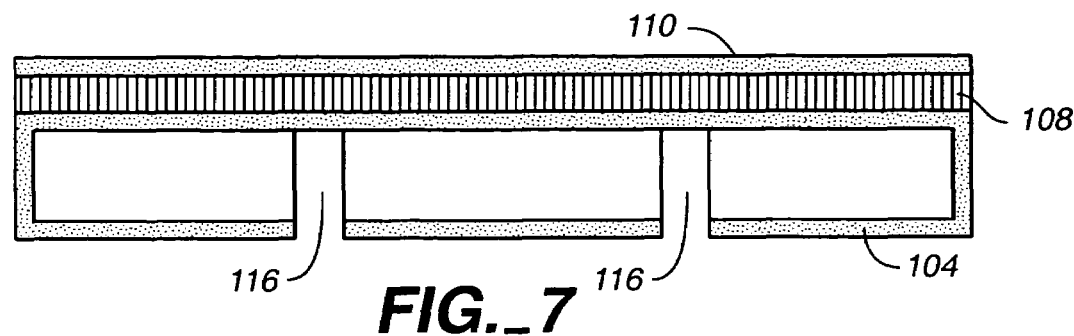
FIG._7

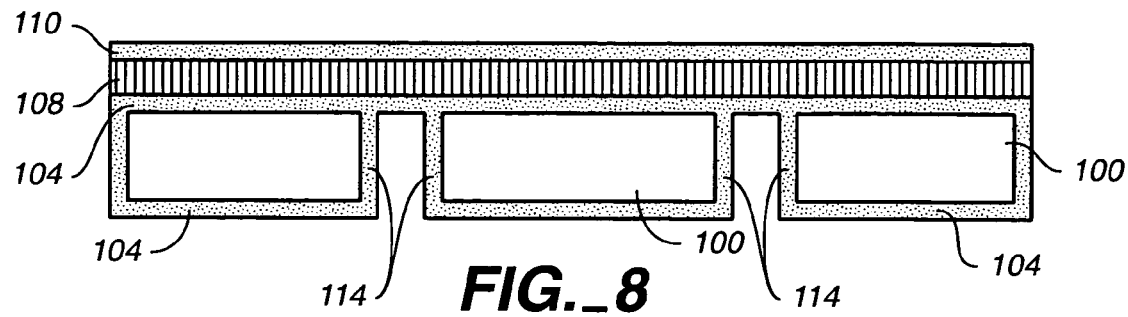
FIG._8
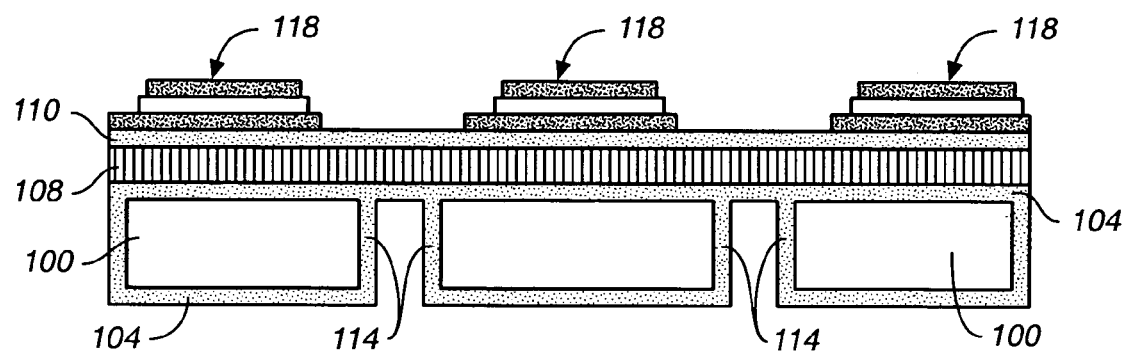
FIG._9
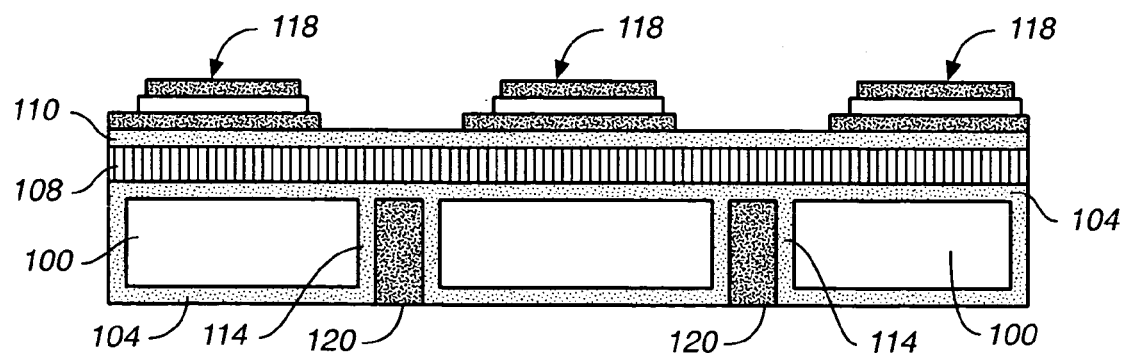
FIG._10

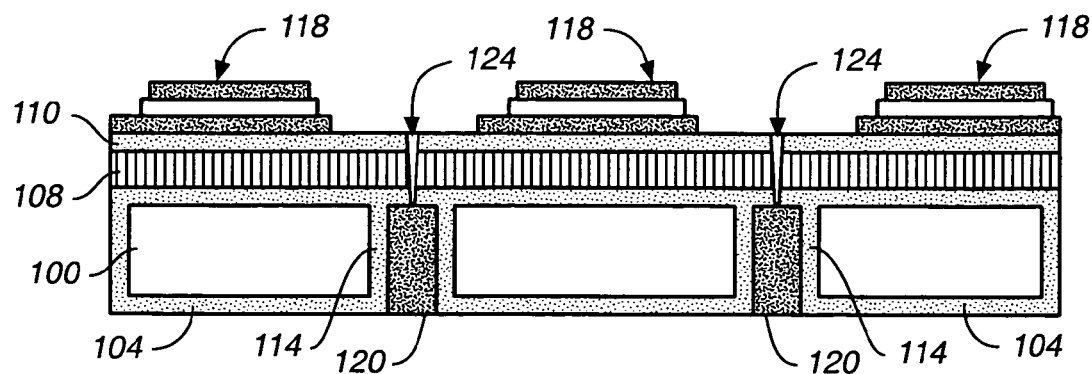
FIG._11
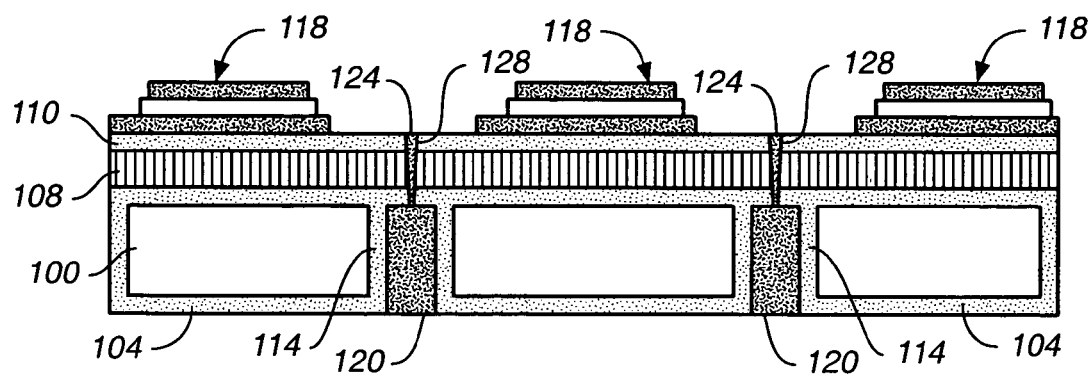
FIG._12
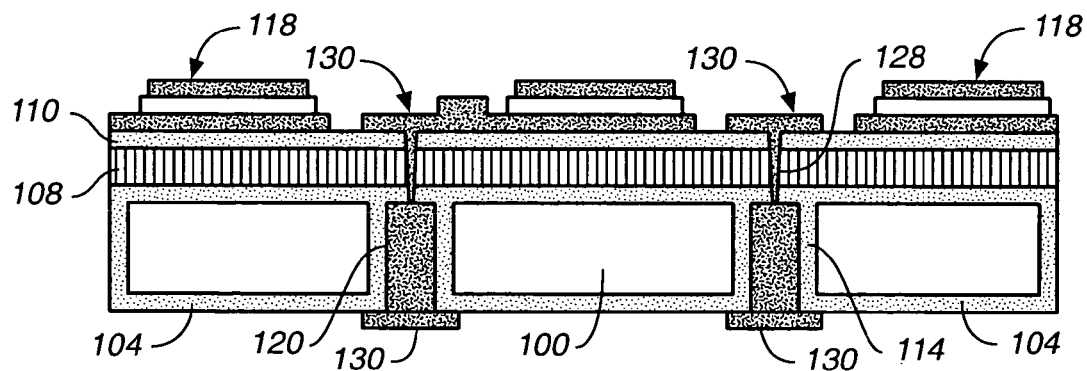
FIG._13

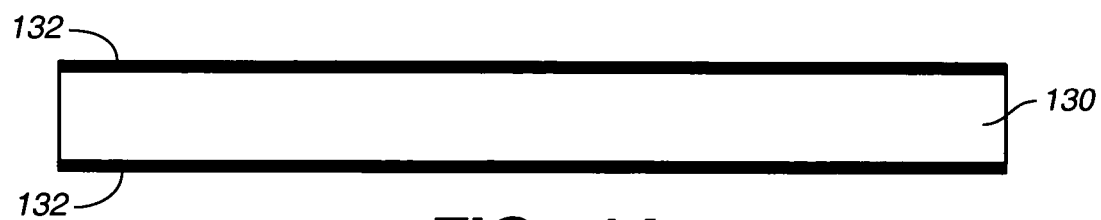
FIG._14
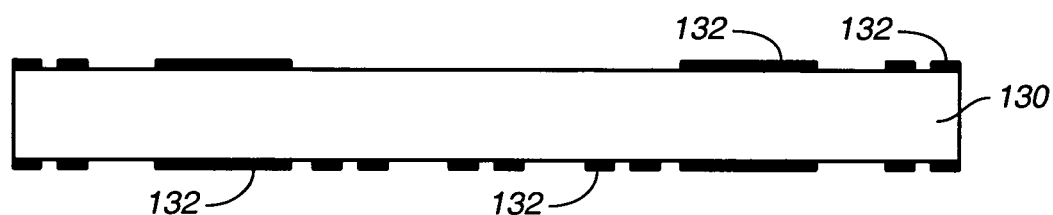
FIG._15
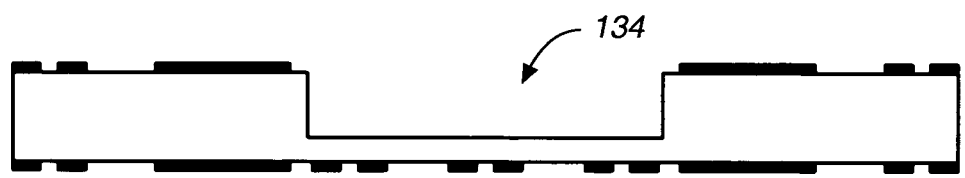
FIG._16
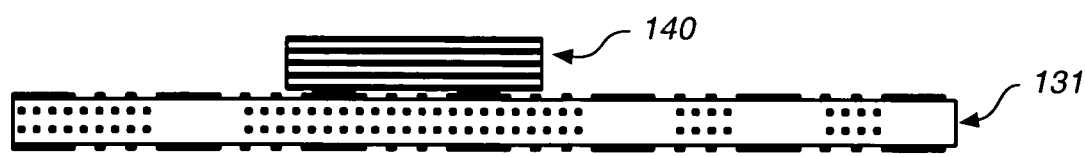
FIG._17

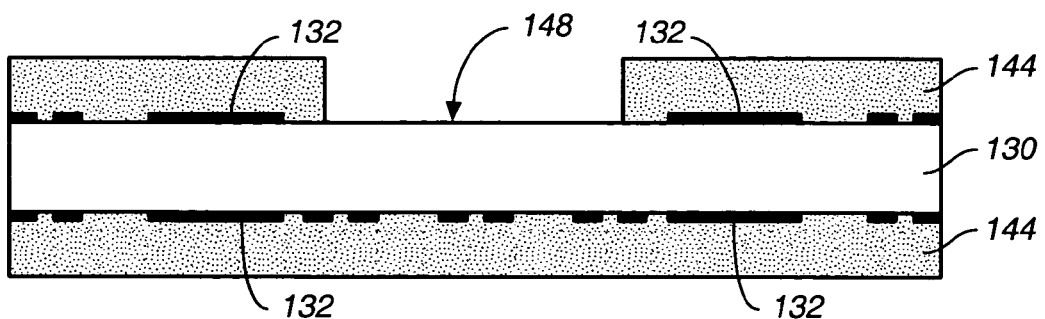
FIG._18
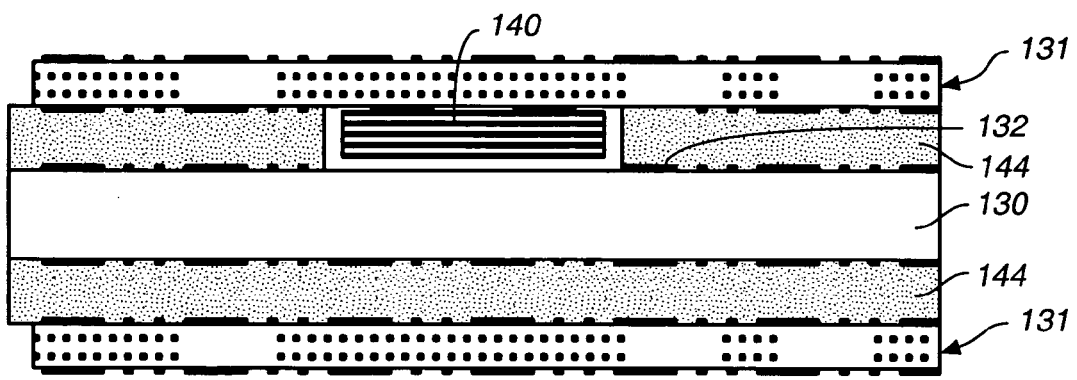
FIG._19
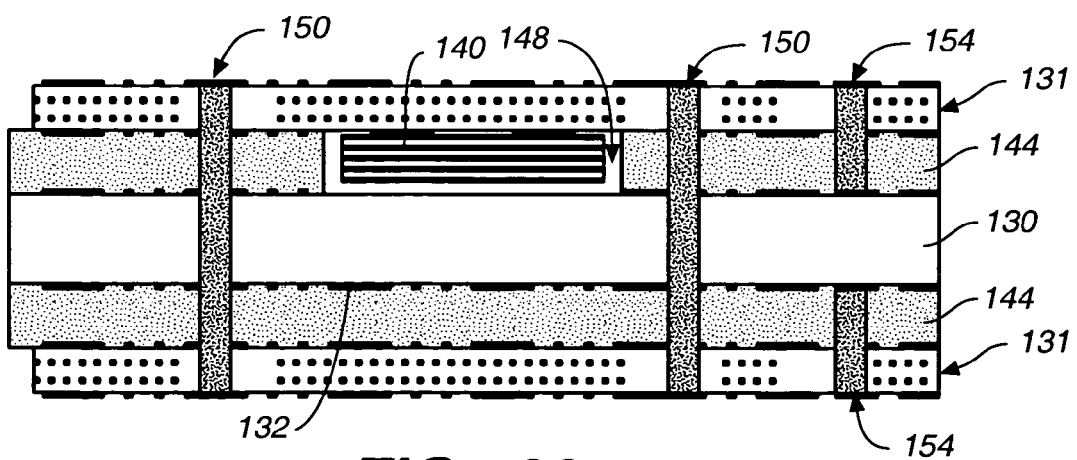
FIG._20

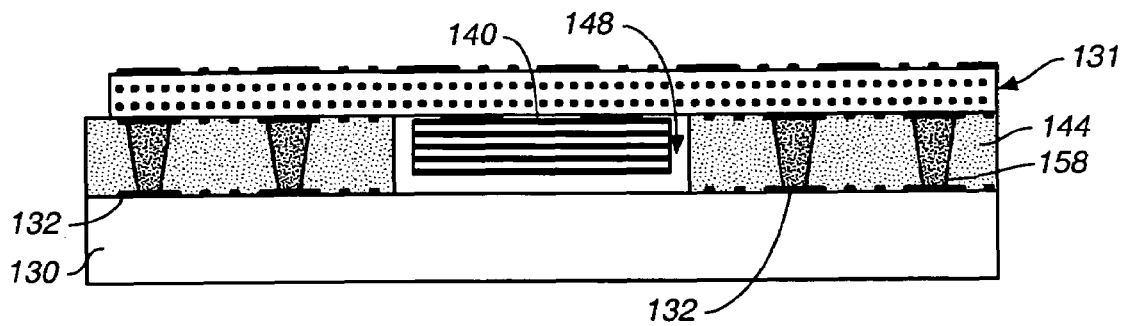
FIG._21
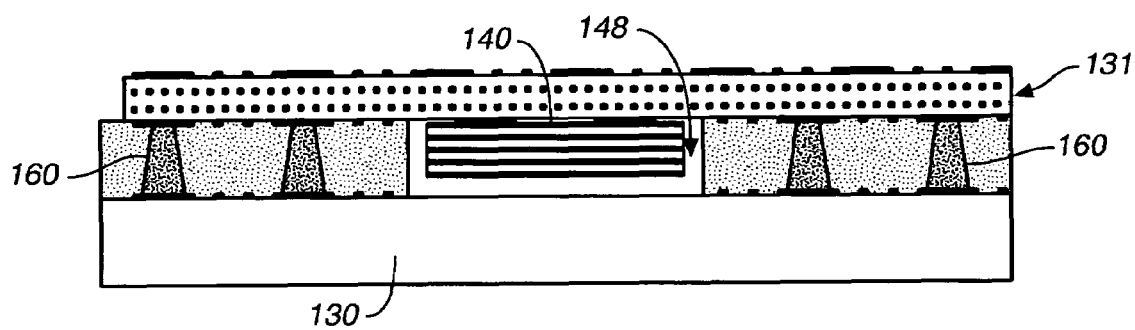
FIG._22
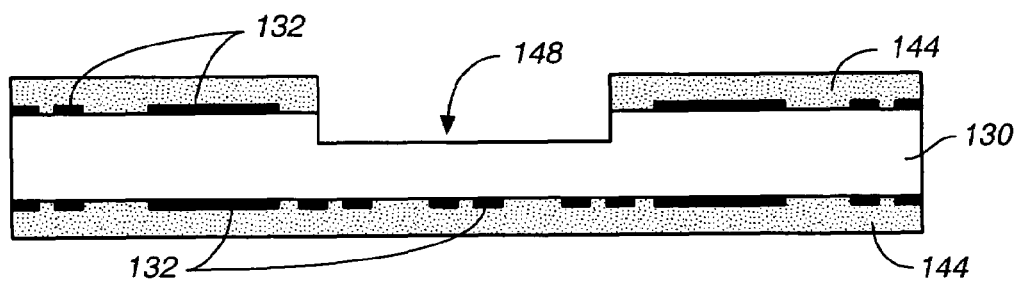
FIG._23
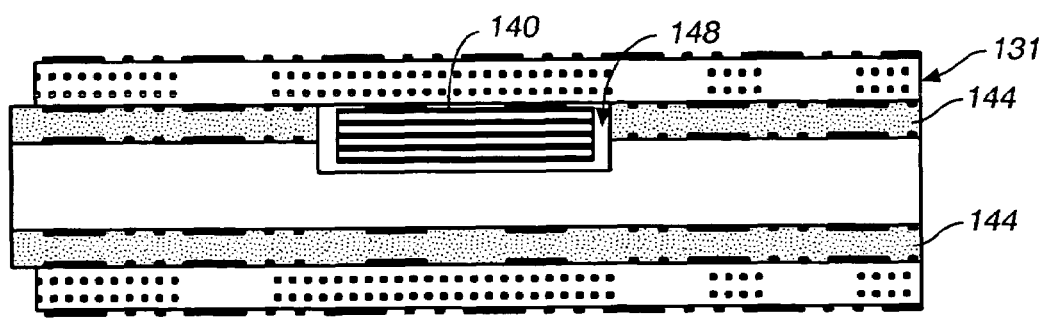
FIG._24

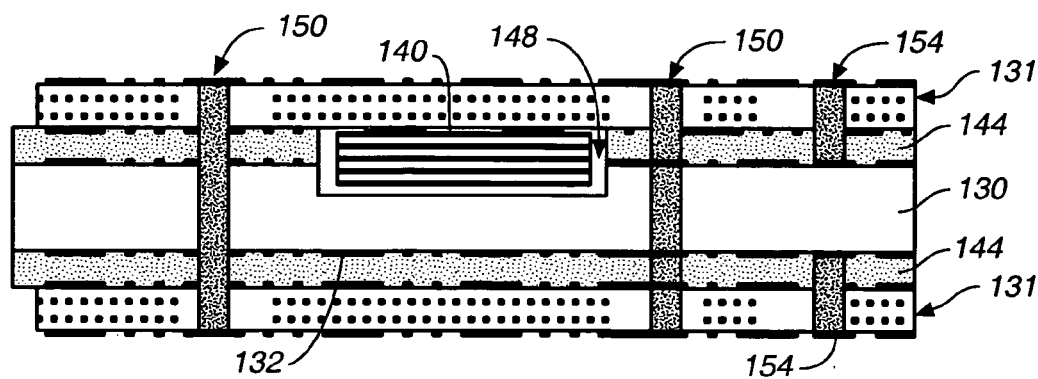
FIG._25
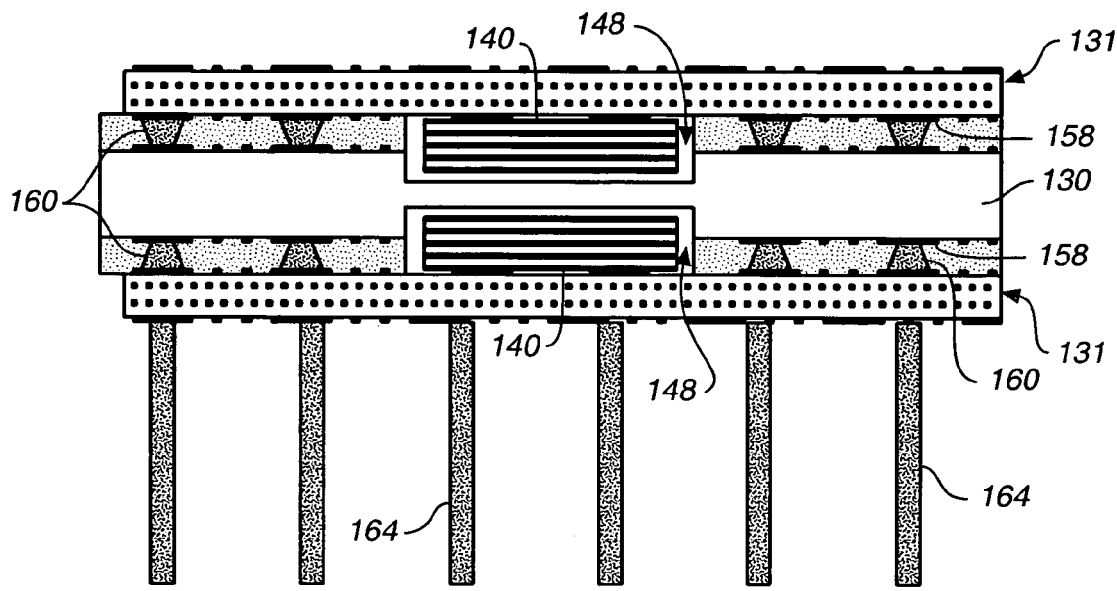
FIG._26
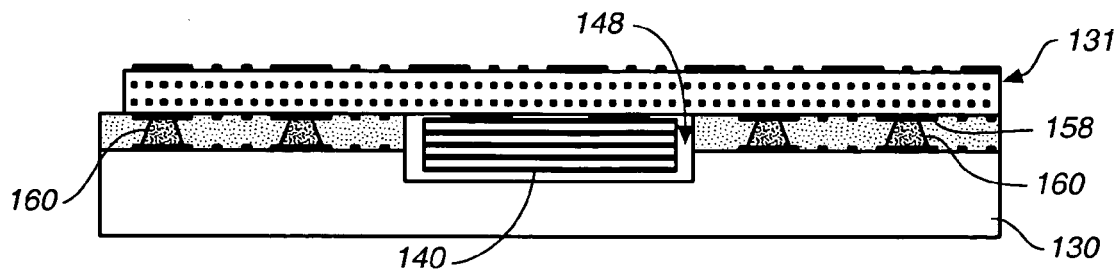
FIG._27

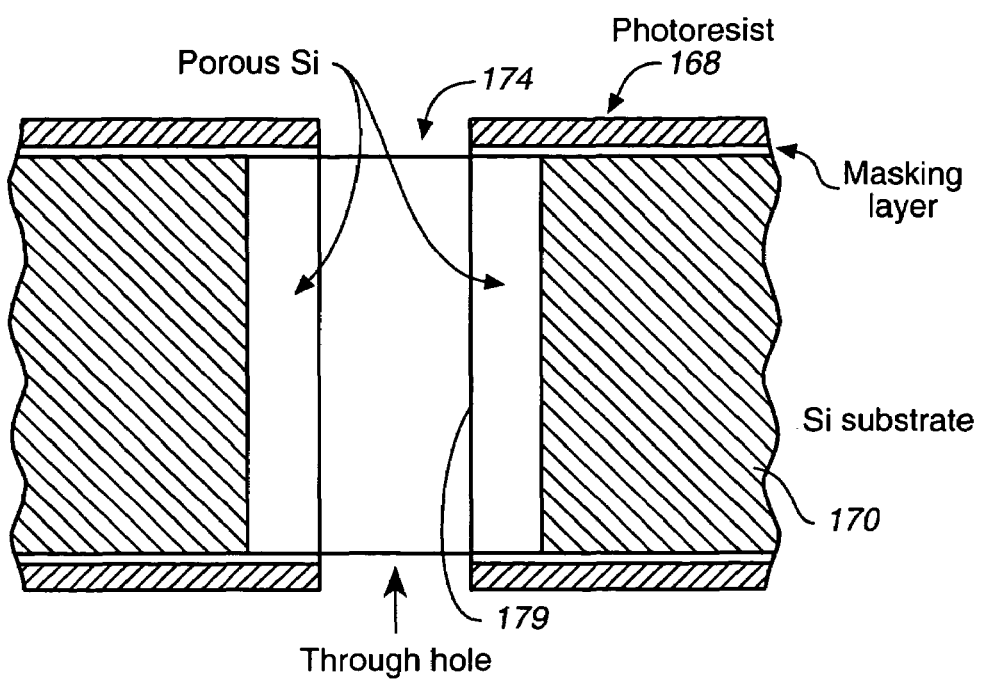
FIG._28
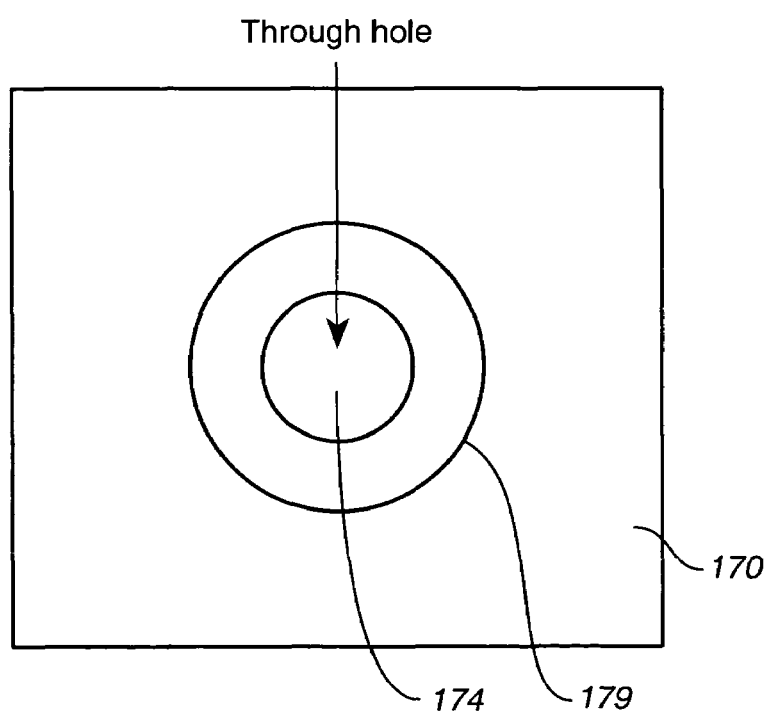
FIG._29

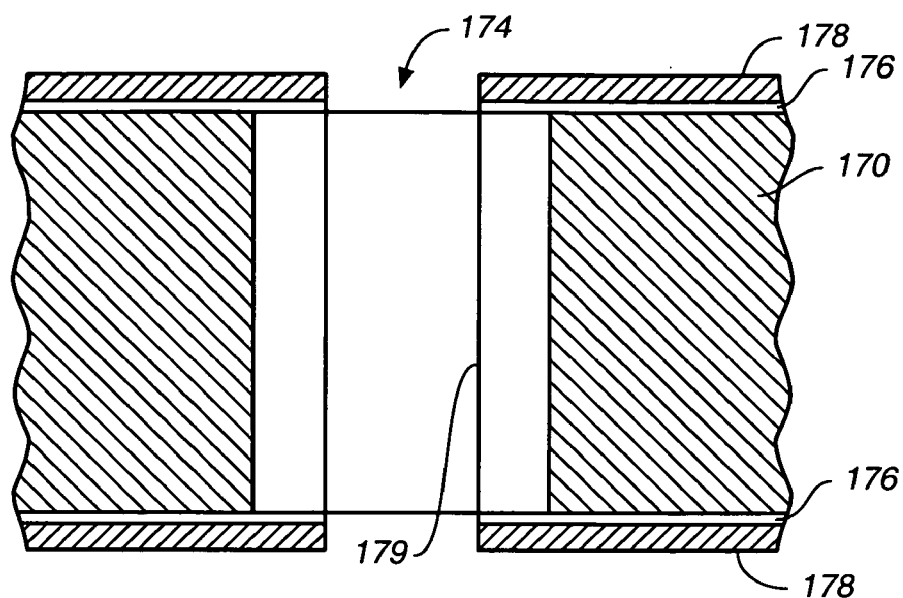
FIG._30
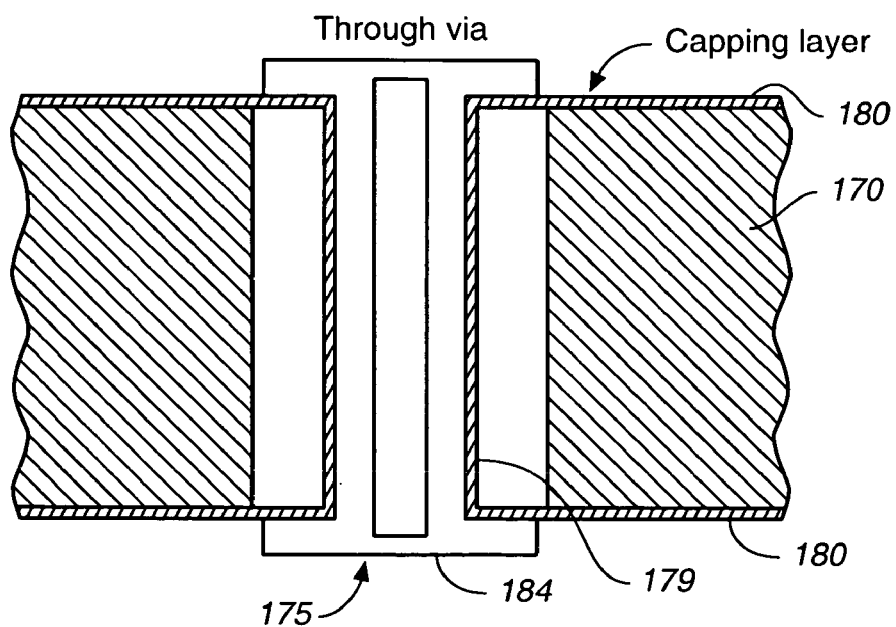
FIG._31

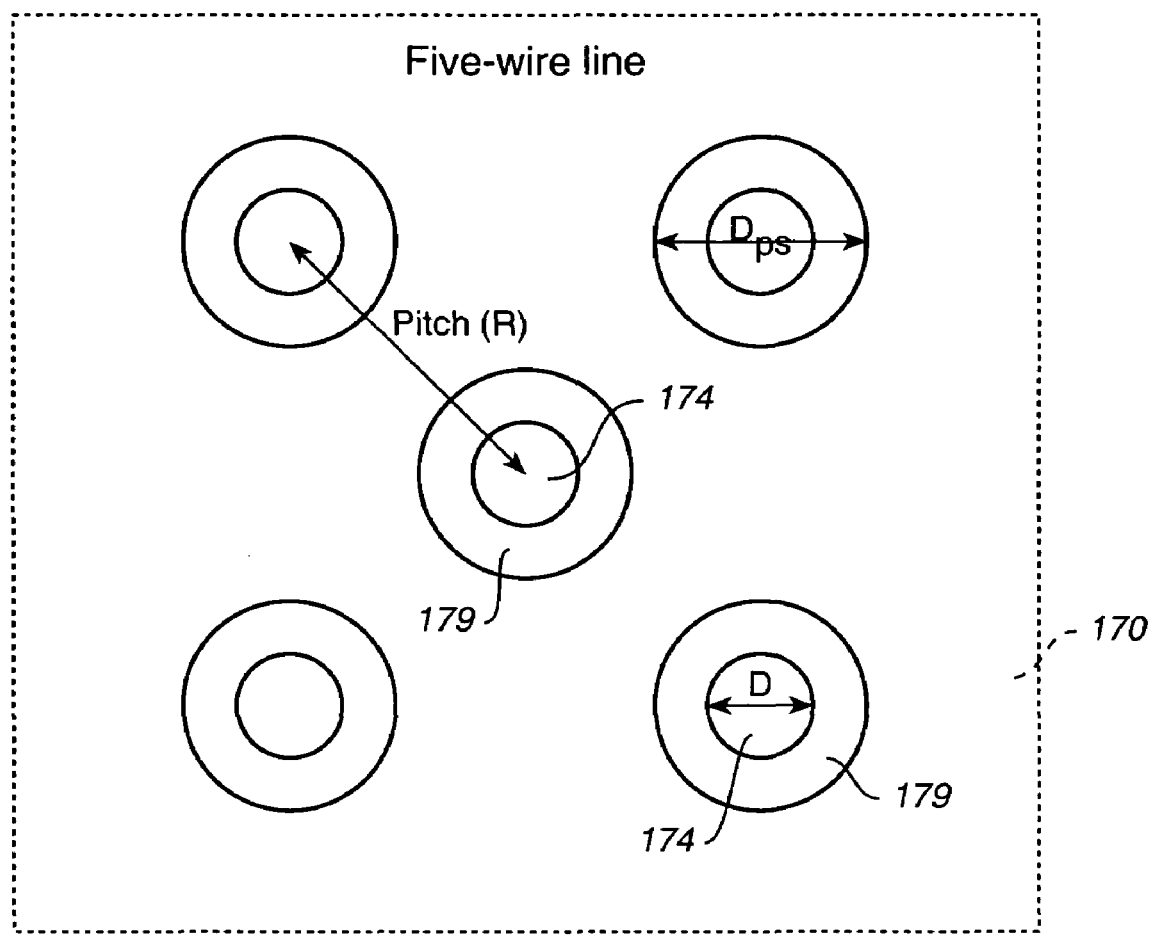
FIG._32

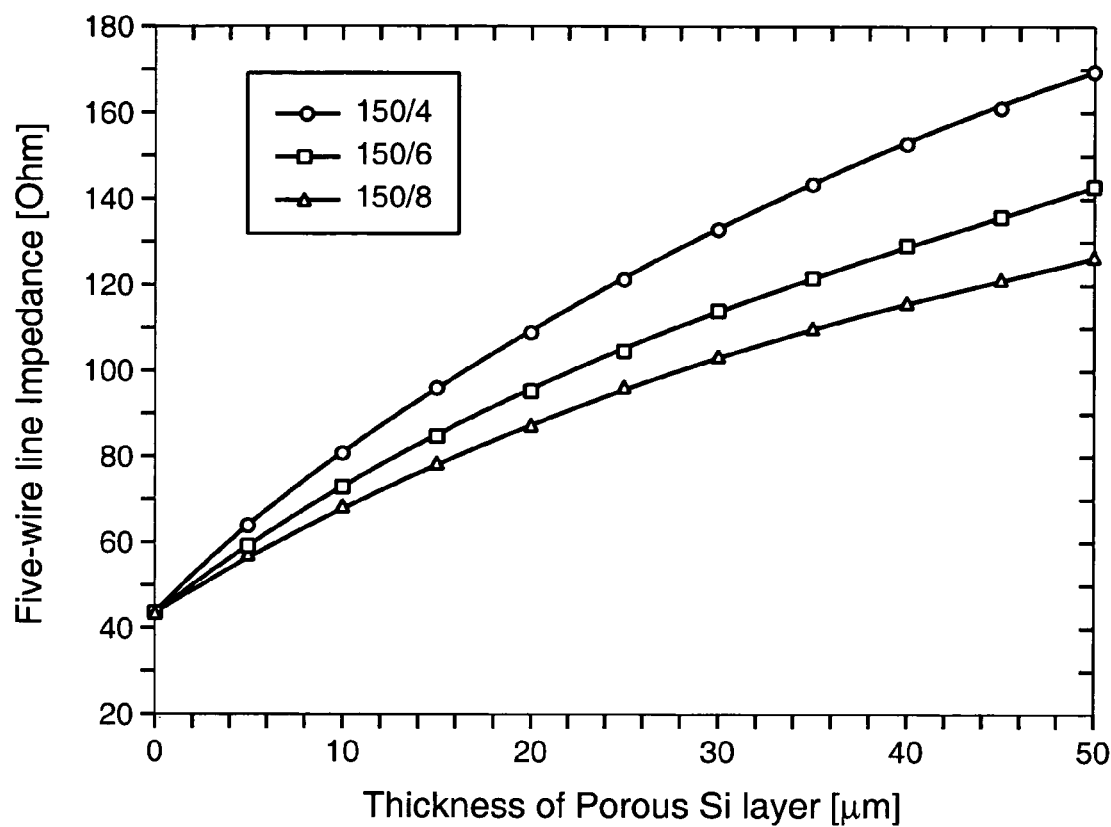
FIG._33

STRUCTURE AND METHOD FOR EMBEDDING CAPACITORS IN Z-CONNECTED MULTI-CHIP MODULES

CROSS-REFERENCE TO RELATED APPLICATION

This application is a division of allowed U.S. patent application Ser. No. 10/007,982, filed Nov. 13, 2001 now U.S. Pat. No. 6,759,257 incorporated herein by reference.

BACKGROUND OF THE INVENTION

1. Field of the Invention

The present invention relates to embedded capacitors. More particularly, the present invention provides a structure and method for embedding capacitors in multi-chip modules.

2. Description of the Prior Art

A bypass capacitor safeguards a power system from signal induced fluctuation by supplying a reservoir of charge on multi-chip modules (MCMs) in close proximity to semiconductor chips. Currently high performance mainframe computers utilize hundreds of surface mounted LICAs (Low Inductance Capacitor Arrays) on MCMs in close proximity to semiconductor chips. These LICAs consume valuable area on MCMs and currently cost from approximately $3 to about $10 each.

As MCMs frequencies increase, parasitic series inductances in the LICAs increase and the utility of LICAs as bypass capacitors decreases. When the series inductance increases, the capacitors ability to rapidly supply charge to a semiconductor chip over a given distance diminishes. Furthermore, the distance from switching drivers at the center of a semiconductor chip is sufficiently far from the LICA capacitors that the flight time prevents these capacitors from attenuating the early switching noise at the high frequencies. As frequencies increase to ~1 GHz the impedence of the parasitic inductance increases to the point that it dominates the LICA component performance. Thus, LICAs may have limited utility beyond a frequency of about 1 GHz.

Recognizing that the inductances and distances between the LICAs and a chip are greater than the inductances and thicknesses of thin film MCMs, a solution to the bypass capacitor problem at GHz frequencies is to embed thin film capacitors within thin film MCMs. Such a solution can provide high frequency (>1 GHz) performance and open up more area for additional active components on MCMs.

When using a buildup process to make an MCM, some defects in embedded thin film capacitor layers are likely to occur. Such defects could become power to ground shorts that render the MCM useless. In order to avoid such an occurrence, one would like to be able to test all capacitors prior to connecting them up to the subsequent build up layers. This is very difficult in build-up structures without having a separate mask available for every conceivable combination of good and defective capacitors. For a large number of capacitors, such a multi-mask approach becomes very impractical. Therefore, what is needed and what has been invented is a structure and method which overcome the foregoing difficulties.

SUMMARY OF THE INVENTION

Embodiments of the present invention provide a method for making a chip module element comprising forming an array of capacitors; electrically testing the capacitors in the array to determine which capacitors are defective and which are acceptable; and storing data of the defective capacitors in an information storage medium. The method further comprises forming an interconnect structure on the array of capacitors, wherein the interconnect structure includes a plurality of conductive elements (e.g., conductive posts and z-connections) and wherein the conductive elements are electrically coupled to the acceptable capacitors. The forming of an interconnect structure comprises forming the plurality of conductive elements using at least one of the following procedures: sputtering, electroless plating, or electrolytic plating. The forming of an interconnect structure may alternatively include laminating an adhesive bonding sheet on the array of capacitors; forming a plurality of apertures in the bonding sheet adjacent to the acceptable capacitors; and depositing a conductive material within the apertures. The forming of an array of capacitors may comprise forming an array of capacitors on a silicon substrate.

Embodiments of the present invention further provide a chip module element having an array of capacitors; a planar interconnect structure coupled to the array of capacitors; and a multilayer circuit structure coupled to the planar interconnect structure. The interconnect structure comprises a plurality of conductive elements (e.g., z-connections and conductive posts) electrically communicating the capacitors and the multilayer circuit structure. A plurality of conductive pins is coupled to the multilayer circuit structure. The array of capacitors is capable of being charged by providing an electrical current which passes from the pins, through the multilayer circuit structure, through the conductive elements, and to the capacitors.

These provisions together with the various ancillary provisions and features which will become apparent to those skilled in the art as the following description proceeds, are attained by the methods and chip module elements of the present invention, preferred embodiments thereof being shown with reference to the accompanying drawings, by way of example only, wherein:

BRIEF DESCRIPTION OF THE DRAWINGS

FIG. 1 is a side sectional view of a substrate assembly having a substrate supporting a capacitor array, an interconnect structure, and a multilayer circuit structure;

FIG. 2A is a schematic view of a laser operated by a computer;

FIG. 2B is a side sectional view of another embodiment of the substrate assembly of FIG. 1;

FIG. 3A is a side sectional view of a further embodiment of the substrate assembly of FIG. 1;

FIG. 3B is an enlarged partial vertical sectional view disclosing a dielectric layer supported by the substrate, and capacitors including a ground layer, a capacitor dielectric layer supported by the ground layer and segmented electrode layers disposed on top of the capacitor dielectric layer;

FIG. 3C is an enlarged partial vertical sectional view of the assembly of FIG. 3B after depositing a second dielectric layer on the capacitor dielectric layer including segmented electrode layers, and after depositing pads on the second dielectric layer and electrically coupling, through conductive-filled openings, one of the pads to one of the electrode segment layers, and after depositing a third dielectric layer on the second dielectric layer and forming openings in the third dielectric layer with a computer operated laser to expose the pads;

FIG. 3D is an enlarged partial vertical sectional view of the assembly of FIG. 3C after the opening in the third dielectric layer was filled with a conductive material to produce a conductive post;

FIG. 3E is an enlarged partial vertical sectional view of the assembly of FIG. 3D after a pad was deposited on the third dielectric layer and in contact with the conductive post;

FIG. 3F is an enlarged partial vertical sectional view of the assembly of FIG. 3B after a were disposed directly on the electrode segment layers;

FIG. 3G is an enlarged partial vertical sectional view of the assembly of FIG. 3F after one of a mask, a dielectric layer, or a bonding sheet was disposed over the pads and electrode segment layers, with the dashed-lines representing an opening to be formed by the computer-operated laser from the top of one of the mask, the dielectric layer, or the bonding sheet down to the pad which is electrically coupled to a non-defective capacitor;

FIG. 3H is an enlarged partial vertical sectional view of the assembly of FIG. 3B after depositing a second dielectric layer over the capacitors including their associated segmented electrode layers, and after depositing pads on the second dielectric layer and electrically coupling, through conductive-filled openings, one of the pads to one of the electrode segment layer which is associated with a viable capacitor, and after depositing a mask layer on the second dielectric layer and forming openings in the mask layer with a computer-operated laser to expose the pad;

FIG. 4 is a side sectional view of a silicon substrate encapsulated in a thermal oxide (e.g., silicon oxide);

FIG. 5 is a side sectional view of the substrate assembly of FIG. 4 after a first dielectric film was deposited on a thermal oxide surface;

FIG. 6 is a side elevational view of the substrate assembly of FIG. 5 after a second dielectric film was deposited on the first dielectric film;

FIG. 7 is a side elevational view of the substrate assembly of FIG. 6 after via-holes were formed through the bottom or back side of the substrate using a thermal oxide layer as a stop;

FIG. 8 is a side elevational view of the substrate assembly of FIG. 7 after thermal oxide layers were formed on the inside walls of the formed via-holes of FIG. 7;

FIG. 9 is a side elevational view of the substrate assembly of FIG. 8 after capacitor assemblies were disposed on the second dielectric film;

FIG. 10 is a side elevational view of the substrate assembly of FIG. 9 after the via-holes were filled with conductive material;

FIG. 11 is a side elevational view of the substrate assembly of FIG. 10 after small via-holes were formed down to the conductive material;

FIG. 12 is a side elevational view of the substrate assembly of FIG. 11 after the small via-holes were filled with small conductive fill;

FIG. 13 is a side elevational view of the substrate assembly of FIG. 12 after pads were disposed in contact with the small conductive fill;

FIG. 14 is a side elevational view of a substrate assembly having a core substrate coated with opposed metal (e.g., copper) coatings;

FIG. 15 is a side elevational view of the substrate assembly of FIG. 14 after the metal coatings were patterned;

FIG. 16 is a side elevational view of the substrate assembly of FIG. 15 after a cavity was formed in the substrate;

FIG. 17 is a side elevational view of the dielectric assembly including a component which is to reside in the cavity shown in FIG. 16;

FIG. 18 is a side elevational view of the substrate assembly of FIG. 16 after a pair of dielectric films were disposed on the opposed patterned metal coatings;

FIG. 19 is a side elevational view of the substrate assembly of FIG. 18 after the dielectric assembly of FIG. 17 was disposed on one of the dielectric films;

FIG. 20 is a side elevational view of the substrate assembly of FIG. 19 after via assemblies were formed in the substrate assembly of FIG. 19;

FIG. 21 is a side elevational view of a substrate assembly having a substrate, a patterned metal layer disposed on the substrate, a dielectric layer having a cavity and disposed on the patterned metal layer and including formed metal post extending there through, and a dielectric film disposed on the dielectric layer such that an associated component lodges in the cavity;

FIG. 22 is a side elevational view of another embodiment of the substrate assembly of FIG. 21;

FIG. 23 is a side elevational view of the substrate assembly of FIG. 18 but with the cavity extending into the substrate;

FIG. 24 is a side elevational view of the substrate assembly of FIG. 23 after the dielectric assembly of FIG. 17 was disposed on one of the dielectric films such that the associated component extends into the cavity including the cavity portion in the substrate;

FIG. 25 is a side elevational view of the substrate assembly of FIG. 24 after via assemblies were formed therein;

FIG. 26 is a side elevational view of the substrate assembly of FIG. 21 with both sides similarly processed and with the substrate having a pair of cavities housing components associated with a pair of dielectric films, and with pins as shown;

FIG. 27 is a side elevational view of a substrate assembly similar to the substrate assembly of FIG. 22 and including a cavity in the substrate wherein a component resides;

FIG. 28 is a vertical sectional view of a silicon substrate having a through hole whose wall is porous silicon;

FIG. 29 is a top plan view of the silicon substrate illustrating the through hole and the porous silicon wall;

FIG. 30 is another vertical sectional view of the silicon substrate of FIG. 28;

FIG. 31 is a vertical sectional view of the silicon substrate of FIG. 31 after the through hole has been filled in with conductive fill to produce a through via;

FIG. 32 is a top plan view of a substrate having a five-wire line configuration used for estimation of the line impedance matching range; and FIG. 33 is a graph of thickness ($\mu$m) of the porous silicon layer vs. five-wire line impedance (ohms).

DETAILED DESCRIPTION OF PREFERRED EMBODIMENTS OF THE INVENTION

Referring in detail now to FIGS. 1–3E, there is seen a substrate assembly, generally illustrated as 10, having substrate 12a (e.g., an AlN or ceramic substrate) supporting a plurality of dielectric layers, all of which will be identified hereinafter. The substrate assembly 10 includes a capacitor array, generally illustrated as 16, comprising capacitors 16a, 16b, 16c, 16d, 16e, 16f and 16g, each of which includes a ground layer 18 as the bottom electrode for all capacitors in the capacitor array 16, an electrode layer segment (identified as 19a, 19b, etc. below), and a dielectric therebetween. The substrate assembly 12 also includes a multilayer circuit structure 54, an interconnect structure 58, and voltage pins 60 and 61, ground pins 26a–26b, and signal pins 63 and 64. Each capacitor (e.g., capacitors 16a, 16b, etc.) includes any suitable dielectric and may be planar or non-planar over surface dielectric layer 20. By way of example only and as best shown in FIG. 1 and in FIG. 3B, the capacitor array 16 includes common dielectric layer 17 which may be formed by any suitable means, well known to those skilled in the art.

Ground layer 18 is preferably continuous and is electrically coupled to ground pins 26a–26b. Ground layer 18 is also electrically coupled to ground layer 24 via conductive lines 30 and 32 which respectively include ground pads 31a–31b and ground pads 33a–33b. The capacitor array 16, i.e., capacitors 16a, 16b, 16c, 16d, 16e, 16f and 16g, include segmented electrode layer, generally illustrated as 19, which in turn is coupled to electrode layer 36 through interconnect structure 54 comprising a plurality of a combination of a pair of pads and a z-connection. More specifically, the following combination of pads and z-connections are respectively coupled to electrode layer segments 19a, 19b, 19c, 19d, 19e and 19f associated with respective capacitors 16a, 16b, 16c, 16d, 16e, 16f and 16g: pads 37a, 37b and z-con pads 39a, 39b and z-connection 40; pads 41a, 41b and z-connection 42; pads 43a, 43b and z-connection 44; pads 45a, 45b and z-connection 46; pads 47a, 47b and z-connection 48; and pads 49a, 49b and z-connection 50. It is to be assumed that capacitors 16d and 16f were previously found to be defective from testing as explained hereinafter. Thus, conductive columns (identified as 89d and 89f below) are represented by dotted-lines, indicating that z-connections 44, 48 were not actually formed, but would have been formed had capacitors 16d and 16f been found acceptable and not defective or flawed.

As previously indicated, electrode layer 19 is segmented into separate capacitor electrodes (i.e., electrode layer segments 19a, 19b, 19c, 19d, 19e and 19f) and floating in voltage or charge with respect to any pins associated with any acceptable capacitor. The segmented electrode layer 19 is preferably disposed on dielectric layer 17 as shown in FIGS. 1 and 3B. A pad (i.e., pads 37b, 39b, 41b, 43b, 45b, 47b and 49b, see FIG. 1) may be plated directly on top of all the separate electrode layer segments as best shown in FIG. 3F. Alternatively, dielectric layer 87 may be disposed on segmented electrode layer 19 and exposed dielectric layer 17 and openings (not shown) may then be drilled (e.g., with laser 78/computer 80) in the dielectric layer 87, followed by forming conductive columns 89, e.g., conductive column 89c formed by electroplating as shown in FIGS. 3C, 3D and 3E. Conductive column 89d is represented by dotted-lines, indicating that conductive-column 89d was not actually formed, but would have been formed had capacitor 16d been found acceptable and not defective or flawed. Subsequently, pads 41b, etc., are disposed on the dielectric layer 87 such as to be in electrical contact with conductive columns 89 (e.g., electrical column 89c as shown in FIG. 3E).

Pads 37b, 39b, 41b, etc., may be employed to test the capacitors for acceptability. More specifically, each of the pads (i.e., pads 3G, 41b, and 43b, etc.) may be tested with respect to a substrate ground (e.g., ground layer 18 in FIG. 1) to determine which of the capacitors (i.e., 16a, 16b, 16c, 16d, 16e, 16f and 16g) is or are shorted; and this test data ("good vs. bad" capacitor data) is accumulated and stored in a computer 80 (see FIG. 2A), more specifically in the memory bank 82 of the computer 80. Each of the capacitors may be alternatively tested via electrode layer segments 19a, 19b, 19c, 19d, etc., and not via the pads.

It is known that gates in integrated circuit chips require electrical charge to switch. In a multichip module, capacitors located proximate to the gates and chips serve as a reservoir of charge. As previously indicated, the capacitors include a film (e.g., dielectric layer 17) which is located close to the chips. As also previously indicated, in the process of manufacturing the capacitor array 16, one or more capacitors may be defective. Short circuits in defective capacitors can render the formed module defective as well.

In embodiments of the invention, defective capacitors are electrically isolated from the chip. For example, in a preferred embodiment, the array 16 of capacitors is formed in accordance with the procedure indicated. The array 16 is then electrically tested, and data of the locations of the defective capacitors are stored in the memory bank 82 of the computer 80. Then, a bonding sheet (e.g., the dielectric layer 87) is placed over the array 16 of capacitors including associated electrode layer segments 19a, 19b, 19c, etc. The laser 78 or other milling means then uses the stored defective capacitor location data to drill apertures (not shown) in the bonding sheet at locations corresponding to the good capacitors so the apertures may be filled to produce conductive columns, such as conductive column 89c. Regions above the defective capacitors are not opened. Thus, the aperture 89d would not have been formed since capacitor 16d was assumed to be defective.

Capacitor defect isolations from capacitor testing may be performed on the produced assemblies. Typically, the testing of the capacitors would also be done prior to the deposition of the dielectric layer 87 and the pads (e.g., pad 41b) as previously indicated. As an example of a testing procedure, the capacitors can be screened for defects by applying a bias voltage and measuring the leakage current. Any capacitors with high leakage currents would then be identified as defects. This information may then be used when laser drilling so that voltage vias (e.g., conductive column 89c) are drilled only to the good capacitors. A laser 78 which is used to form openings over good capacitors is operated by computer 80. The information on defective capacitors are stored in the memory bank 82 of the computer 80 which controls the operation of the laser 78. When the laser 78 is over a defective capacitor (e.g. capacitor 16d), the computer 80 prevents the laser 78 from being activated and subsequently moves the laser 78 over a good capacitor. Thus, the computer 80 moves the laser 78 only over non-defective, good capacitors for laser-drilling purposes.

As further previously indicated, openings 95 are formed, such as with the laser 78. In the embodiment of the invention in FIG. 1, solder is deposited in the openings 95. A multilayer circuit structure 54 (e.g., with a S, V or G layer and pads) can be separately formed and then laminated to the bonding sheet (e.g., the dielectric layer 87). The defective capacitors do not have z-connections above them and they are isolated. The separately formed circuit structure 54 is then laminated to the bonding sheet. The conductive pathway for charging good capacitors is indirect. A good capacitor is charged as current flows in direction of the arrows A, B and C; that is through V pin 60, up to V plane or electrode layer 36 of the multilayer circuit structure 54, and through pads 37a and 37b to capacitor 16a, as shown in FIG. 1.

In the embodiment of the invention illustrated in FIG. 3A, substrate 12b (e.g., a silicon substrate) is coupled to substrate 12a through a z-connection assembly 13, which includes z-connections 13a, 13b, 13c, 13d, 13e and 13f. Substrate 12b supports capacitor array 16 by the interconnect structure 58 by pins 60, 26a, 63, 41, 26b and 64. Thus, electrical pathways are formed through substrate 12b by the embodiment of the invention illustrated in FIG. 2B, a removable mask (e.g., a hard mask, such as SiN, or a photoresist) is used instead of a bonding sheet. As shown in FIG. 3H, the layer 97 of suitable mask material is disposed on top of layer 87 or on top of layer 17. Laser 78 then forms apertures 99 in the layer 97 such that apertures 99 are aligned with the good capacitors (e.g., capacitors 16a, 16b, 16c, 16e and 16g). After the apertures 99 were formed, an array 70 of conductive posts (i.e., conductive posts 70a, 70b, 70c, 70d and 70e) are then formed above the good capacitors by, e.g., electroplating. The layer 97 of the mask is stripped leaving the array 70 of standing conductive posts. Then, the multilayer circuit structure 54 (e.g., with a S, V or G layer and pads) can be formed on the array 70 of conductive posts using a standard build up process.

Referring now to FIGS. 4–13 there is illustrated a structure and method for making multifunctional multi-chip module substrates with high densities of construing thru-holes. Future MCM substrates preferably possess higher operation frequency, high CPU count, and finer pin pitch to increase input/output capabilities. It may be possible to meet all three of these objectives by using embedded perovskite capacitors on micromachined silicon (Si) substrates. The embedded perovskite capacitance materials, such as PZT and BST, may provide sufficient bypass capacitance to both enable >GHz speeds and free up area on the module face that would otherwise be occupied by hundreds of discrete passives, such as LICAs, which can now be used for additional CPUs. Micromachined silicon provides both the planarity for high yields of the perovskite capacitors and the pitch reduction of the thru-via to a value less than about 1 mm. In order to achieve the highest thru-hole densities in a substrate, Deep Reactive Ion Etching (DRIE) of silicon may be used to form essentially 90° walls in thru-hole vias on the order of about 100 microns diameter or less through greater than about 2 mm of Si with pitches having a value as low as 450 micron. The thru-holes must be electrically insulated from one another to assure utility of the structure. A process and structure for incorporating both capacitors and electrically isolating thru-vias is illustrated in FIGS. 4–13. More specifically, FIGS. 4–13 illustrate a structure and method for making multifunctional multi-chip module substrates with high densities of conducting thru-holes. In order to achieve the best yields with high capacitance density materials, such as thin films of ferroelectric or paraelectric perovskites (e.g., PZT or BST), the planarity of silicon wafers for high capacitive yields is very desirable.

Referring more particularly to FIGS. 4–13, there is seen a silicon (Si) wafer 100 having a thickness ranging from about 200 μm to about 3000 μm. The Si wafer 100 is encapsulated in silicon dioxide ($SiO_2$) (i.e., a thermal oxide) surrounding layer 104 having a thickness ranging from about 1 to about 3 microns. The $SiO_2$ surrounding layer 104 was thermally grown from the Si wafer 100 in an oxidation environment. The $SiO_2$ layer 104 may function as an etch stop for DRIE. After the $SiO_2$ surrounding layer 104 has been formulated, a suitable dielectric layer 108 (e.g., $Si_3N_4$, oxynitride, TEOS, LTO, etc.) is deposed on the oxidated structure of FIG. 4 for giving structural support to the Si wafer 100 and to ensure planarity after the vias (identified as "116" below) are formed.

Optional further dielectric layer(s) 110 may be deposited on the dielectric layer 108 for purposes such as electrode adhesion or stress state (e.g., the degree of tensile or compressive stress). Stress state can effect reliability and yield (e.g., cracking) and capacitor yields/performance. The back side of the wafer 100 is plasma, laser, or chemically etched/drilled to form vias 116, stopping on the $SiO_2$ oxide layer, or on dielectric layer 108 or 110 (see FIG. 7). This step may require pre-drill masking processes and subsequent mask removal steps, well known to those skilled in the art.

A thermal $SiO_2$ oxide layer 114 is grown within the vias 116 in order to electrically insulate them from one another. $SiO_2$ oxide layer 114 may possess any suitable thickness, such as one ranging from about 0.25 μm to about 3.00 μm. Alternatively, other CVD passivations of the via 116 surfaces may be performed. In some embodiments of the present inventions, the vias 116 can be filled with a conducting medium 120 at this time.

The capacitors 118 are manufactured on the top-side by any appropriate set of processes. The vias 116 may be filled with a conducting medium 120 at this time (if not already done so previously). An adhesion promoting layer may first be required, such as TiN.

The top-side of the wafer assembly of FIG. 10 is plasma, laser, or chemically etched/drilled to produce vias 124 which are aligned to and stopping on conducting media 120. These vias 124 are to be smaller in diameter than the thru-vias 114. This step may require pre-drill masking processes and subsequent mask removal steps, well known to those skilled in the art. The vias 124 are lined or plated with metal or plate 128 from conducting fill. This step may require (a) backside conducting seed deposition and subsequent etch and/or (b) front-side masking and subsequent strip.

Some embodiments of the invention may now include additional masking and plating steps for pads, interconnects, routing, etc., conjunctively broadly illustrated as 130, if not already previously incorporated. Additional processes such as pinning, subsequent layer built-up, z-connections, surface mount, etc., may now be performed.

Referring now to FIGS. 14–27, there is illustrated a structure and method for making multilayer electrical substrates with embedded components using parallel processed films. Components include integrated electronics Si, GaAs, Si/Ge, etc., as well as sufficiently small commercial passive components. The structure possesses many microFarads of capacitance for bypass applications in high frequency module applications. Embedding valuable components in substrates will become increasingly important as frequency and density demands drive the market. In order to meet state of the art demand, detached components may need to be embedded in a cost effective manner.

In FIG. 14 there is seen a single or multi-layer core substrate 130. Embodiments of the present invention include cores substrates 130 with an without a copper coating 132. Embodiments of the present invention also include core substrates 130 with internal Cu layers. Further embodiments of the invention utilize resin coated copper (RCC). Embodiments using preexisting conducting thru-vias are also included within the spirit and scope of the present invention.

After the core substrate 130 was formed with Cu coatings 132—132, the core coatings 132—132 may be patterned and etched to produce the structure of FIG. 15. Embodiments using subtractive, additive, and semi-additive patterning are all included. In some embodiments of the invention, the Cu coating 132 is completely etched away where a component (identified as "140" below) is to be embedded. In other embodiments a component is to be placed on both sides of the core substrate 130. In additional embodiments as best shown in FIG. 16, a preformed (e.g., milled, cut, or drilled) cavity 134 may be formed in which a component may subsequently be placed. Core substrates 130 with internal Cu layers may have the core cavity 134 lased away with the Cu layer acting as a lase-stop.

Components 140 (see FIG. 17), broadly illustrated as 131, to be embedded are assembled on detached dielectric (possibly multilayer) or flexible films, broadly illustrated as 131, that have been manufactured, preferably manufactured in parallel. In some embodiments, high temperature soldering (e.g., Au-20Sn, Au-12Ge, Au-3.5Si, or Pb-5Sn), or conductive adhesives are used to assure reliability in subsequent processing and usage of the substrate core 130. In other embodiments there is no pad layer on the bottom sides which will eventually be the sop side, of the dielectric film 131. In additional embodiments of the invention, pins, stud bumps, or solder bumps may be attached to a surface of the dielectric film 131 that will be exposed to become the bottom side of the core substrate 130.

Referring now to FIGS. 18–22 for various embodiments illustrating attaching components 140 (includes one or more dielectric films) to a core substrate 130 (not having any cavity 134 (i.e., an uncavitizied core substrate 130) dielectric layers 144—144 are placed, flowed, spinned-on, sprayed or laminated onto the patterned-copper core substrate 130 of FIG. 15. It may be necessary to align pre-cut pre-preg (or similar material). A dielectric cavity 148 is formed in one of the dielectric layers 144 for receiving component 140. It is to be noted that additional underfill, glop-top, or other adhesive/sealant materials may optionally be dispensed over component(s) 140 prior to any subsequent processing. The dielectric film 131, including the attached component 140, may be laminated to the layered structure of FIG. 18 such that component 140 lodges in the cavity 148, as best seen in FIG. 19. The dielectric films 131—131 may be laminated on both sides for stress balance.

Subsequently, through-via assemblies 150 are formed by drill, desmear, e-less, Cu seed/plate, e-plate Cu, and through-vias are then filled and then panelized. In some embodiments where there is no pad layer on exposed side of dielectric film 131, patterning and/or pad layer may be fabricated. In other embodiments, the through-via assemblies 150 may be Cu-capped. In additional embodiments, two types of drilling steps may be used and blind via assemblies 154 (see FIG. 20) may be formulated such as not to extend through core substrate 130.

In FIG. 21, there are seen z-connections 158 are made in the adhesive dielectric film 131 during lamination by solder or conductive paste fill methodologies known in the art. In FIG. 22, metal posts 160 (e.g., Cu) are plated up on core substrate 130 (or spacers residing on core substrate 130) for which z-connections are made in adhesive dielectric during lamination by thin solder, diffusion bonding transient liquid, or conductive paste methodologies known in the art.

Referring now to FIGS. 23–27 for various embodiments of a cavitized core, dielectric layers 144—144 are placed, flowed, spun-on, sprayed or laminated onto patterned-copper core substrate 130. It may be necessary to align pre-cut pre-preg (or similar material). Additional underfill, glop-top, or other adhesive/sealant materials may optionally be dispensed over component(s) 140 prior to subsequent processing. Subsequently, and as best shown in FIG. 24, dielectric films 131—131, including attached component 140, may be laminated to the structure of FIG. 23 such that component 140 resides in cavity 148.

Dielectric films 131—131 may be laminated on both sides for stress balance, as best shown in FIG. 24. Subsequently, through-via assemblies 150 are formed by drill, desmear, e-less, Cu seed/plate, e-plate Cu, through-vias are filled and then panelized. In some embodiments where there is no pad layer on an exposed side of the dielectric film 131, patterning and/or pad layer may be fabricated. In other embodiments, the vias may be Cu-capped. In additional embodiments, two types of drilling steps may be used, and blind via assemblies 154 may be formulated, such as not to extend through core substrate 130.

Referring now to FIG. 26, there are seen z-connections 158 made in the adhesive dielectric film 131 during lamination by solder or conductive paste fill methodologies known in the art. Double sided processing with pins 164 is shown in FIG. 26. Metal posts (e.g., Cu) 160 are plated up on core substrate 130 (or spacers residing on core) for which z-connections 158 are made in adhesive dielectric film 131 during lamination by thin solder, diffusion bonding transient liquid, or conductive paste methodologies known in the art. An embedded laminate board is now available (e.g., now ready for final IC attach assembly) for either final assembly or dielectric build up by means which are well known in the art. Alternatively, post plating for stacked via build-up structures or more standard staggered via structures may now proceed as known in the art.

As previously indicated, embedded perovskite capacitance materials, such as PZT and BST, may provide sufficient bypass capacitance to both enable >GHz speeds and free up real estate on the module face that would otherwise be occupied by hundreds of discrete passives such as LICAs. Also they can be placed directly beneath the chip compared to LICAs along the periphery. It should be noted that perovskite processing temperatures (e.g., temperatures >600° C.) do not allow their fabrication directly on some substrate materials (i.e., organic laminates).

Referring now to FIGS. 28–33 there is seen a through-via structure 168 with adjustable impedance formed in a silicon substrate 170, and an illustration of a method for making a through-via structure 168.

Several approaches have been developed in order to incorporate Si substrates into integrated circuit (IC) packages. As an example, Si can be used as a multifunctional interposer, which can contain embedded passive components, provide the CTE matching between the IC and PCB, allow very high routing density, etc. To use a silicon substrate, such as substrate 170, as an interposer vertical through-vias (e.g., via 175 in FIG. 31) should be formed in the silicon substrate 170 to provide connection between the IC and PCB. Several requirements must be fulfilled in order to enable adequate usage of through-vias in the silicon substrate 170. The vias must be isolated from the conductive Si substrate 170, and impedance of the wiring should be matched to the impedance of the other IC and PCB lines to minimize signal reflections, etc. Referring now to FIG. 31, a silicon substrate 170 includes a through-via 175 surrounded with a porous silicon region 178, which can be used to isolate the via 175 from the silicon substrate 170, as well as to adjust the via characteristic impedance to match the requirements.

The use of micromachined silicon for integrated passives, high density interconnects, isolated RF from digital functions, and optics in packaging are increasing worldwide. A novel approach, as illustrated in FIGS. 30–32, is capable of providing constant and controlled signal line impedances in the 50–70Ω range within micromachined silicon packages. Such matching signal impedances within the package will be imperative in future high frequency packaging applications. A structure of the through-via 175 formed in the silicon substrate 170 is disclosed in FIGS. 28–31. The silicon substrate 170 is coated with a mask layer 176 and photoresist 178. The photoresist 178 is patterned and in the mask layer 176 is etched to form through-hole 174. Thus, the through hole 174 is formed in the silicon substrate 170 through the mask layer 176. By means of electrochemical anodization technique, the porous silicon region 179 is formed radially around the through-hole 174. Stabilization of porous silicon region 179 is performed. After removal of the mask layer 176 and photoresist 178, the through-hole 174 is covered with a capping layer 180, followed by formation of the through-via 175 by metal plating 184.

Some materials properties of porous silicon (PS) make its usage in microelectronics packages of practical advantage. Despite highly crystalline silicon structure and relatively high material density (20–80% of regular silicon), porous silicon is an isolating material. Even though formed in highly conductive silicon substrates with resistivities as low as 10 mOhm cm, porous silicon can have resistivity of up to $10^{12}$ Ohm cm. Due to its porous nature, porous silicon can have a very low dielectric constant of 2. However, for standard material porosities (30–60%) the dielectric constant is in the range of $\epsilon=3-6$.

Porous silicon is formed by anodic etching of the silicon substrate 170 in concentrated aqueous or ethanoic hydroflouric acid solutions. Different types of porous silicon can be made depending on the substrate doping and etching conditions. Etch rate may be as high as 10 μm/min and, therefore, large porous areas can be formed in silicon in relatively short times.

Several different process flows may be used to create the isolating structures with porous silison surrounding the through-holes 174. By way of example only, silicon substrate 170 is covered with the thin mask layer 176, which may be either metal or dielectric. The only requirement is that the mask 176 should be not solvable in a concentrated HF solution. The substrate 170 is then coated with photoresist 178, which is patterned with photolithography. Mask layer 176 is patterned through the photoresist 178. Through-holes 174 are etched in silicon using, for example, DREI (deep reactive ion etching). Porous silicon 179 is formed radially around the through holes 174 by anodization in HF solution. Since the rest of the wafer is covered with photoresist 178. PS is formed only inside of the through-holes 174. Surface of PS is stabilized by thermal annealing in oxygen atmosphere at 250–300° C. (pre-oxidation). The capping layer 180, for example, CVD silicon oxide, is deposited to cover the formed porous silicon 179. This protects pre-oxidized porous silicon from atmospheric contaminations and water uptake.

It should be noted at this point that there are several variable parameters, which can be adjusted to control properties of the porous silicon layer 179. First of all different thicknesses of the porous silicon layer 179 can be formed that affects via impedance as it will be shown below. In addition, porosity of porous silicon can be adjusted to change the dielectric constant of porous silicon layer 179 surrounding the via opening. Also, if necessary porous silicon can be completely oxidized, i.e., transformed into porous silicon oxide. This may improve isolating properties and further reduce the dielectric constant. Although, full oxidation will require elevated processing temperatures of about 1000° C., which might not be acceptable for all processes.

An example of a through-via formation in a through-hole isolated with porous silicon is depicted in FIG. 31. The through-hole 174 with porous silicon 179 is covered with the capping layer 180. An additive or substractive electroplating processes can be applied to form the through-vias 175 in form of plated through-holes (PTH). Depending on the aspect ratio of the holes 174, advanced technologies can be applied to fill through-holes 174 with metal completely. In the case of plated through-holes the vias can be filled with one of the standard processes, e.g., with conductive epoxy. The final structure of a via filled is shown in FIG. 31.

To demonstrate the ability of the disclosed structure to be used for adjustment of the wiring impedance, a five-wire line impedance was calculated as a function of porous silicon layer thickness for several different dielectric constants of porous silicon. As mentioned before, dielectric constant can be varied by changing porosity of the porous silicon layer. A schematic presentation of the five-wire line structure calculated is shown in FIG. 32. The calculation was performed for a pitch (R) of 150 μm, which is predicted by a semiconductor road map to be in use in the fixture. The diameter of the via (D) was taken, as an example, equal to 30 μm. The range of porous silicon ring thicknesses was 0–15 μm. In FIG. 33, the results of the calculation are shown. The characteristic impedance for the presented configuration without porous silicon ring was calculated to be 42 Ohm. The calculations presented demonstrate that the wiring impedance can be varied in the range from 40 up to more than 130 Ohms using porous silicon isolation. Standard specification usually require the characteristic impedance of the wiring to be in the range of 50–70 Ohms which can be easily achieved with the porous silicon isolation presented. Since two parameters, namely the porous silicon layer thickness and porosity, are variable a very fine tuning of the impedance becomes possible.

Thus, by the practice of the invention illustrated in FIGS. 28–33, a process is provided which allows to form electrically isolated through-vias in a silicon substrate. Since the cylindrical porous silicon structures have adjustable properties, namely the dielectric constant and the wall thickness, the impedance of through-vias formed this way can be tuned to match the required specifications. Matching of the characteristic impedance allows significant improvement of the electrical properties of IC packages. This reduces reflections in transmission lines and thus leads to low loss electrical interconnections. Using of porous silicon for via isolation has several other advantages over organic polymer materials. Some of them are better CTE match to silicon substrate, higher mechanical stability, compatibility with high temperature processing (e.g., up to 700° C. for non-oxidized porous silicon, and >1000° C. for oxidized porous silicon).

While the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the scope and spirit of the invention as set forth. Therefore, many modifications may be made to adapt a particular situation or material to the teachings of the invention without departing from the essential scope and spirit of the present invention. It is intended that the invention not be limited to the particular embodiment disclosed as the best mode contemplated for carrying out this invention, but that the invention will include all embodiments and equivalents falling within the scope of the appended claims.

What is claimed is:

1. A chip module element comprising:
   an array of capacitors;
   a planar interconnect structure coupled to the array of capacitors;

a multilayer circuit structure coupled to the planar interconnect structure which comprises a plurality of conductive elements electrically communicating the capacitors and the multilayer circuit structure; and a plurality of conductive pins coupled to the multilayer circuit structure, wherein the array of capacitors is embedded in the planar interconnect structure; and wherein the array of capacitors is capable of being charged by providing an electrical current which passes from the pins, through the multilayer circuit structure, through the conductive elements, and to the capacitors.

2. The chip module element of claim 1 wherein said conductive elements are selected from the group consisting of conductive posts and z-connections.

3. The chip module element of claim 1 wherein said array of capacitors has a common ground layer, an electrode layer and a dielectric material therebetween.

4. The chip module element of claim 3 wherein said electrode layer may be segmented into separate capacitor electrodes.

5. The chip module element of claim 1 wherein at least one of said capacitors is defective and said defective capacitor is isolated from the multilayer circuit structure.

* * * * *